(12) United States Patent
Kim

(10) Patent No.: US 6,208,092 B1
(45) Date of Patent: Mar. 27, 2001

(54) APPARATUS AND METHOD FOR DIGITAL DEFLECTION PROCESSING

(75) Inventor: Kyoung-Hwan Kim, Yongin (KR)

(73) Assignee: Samsung Electronics, Co. LTD (KR)

( * ) Notice: Subject to any disclaimer, the term of this patent is extended or adjusted under 35 U.S.C. 154(b) by 0 days.

(21) Appl. No.: 09/193,053

(22) Filed: Nov. 16, 1998

(30) Foreign Application Priority Data

Nov. 11, 1997 (KR) .................................................. 97-61290
Jul. 28, 1998 (KR) .................................................. 98-30384

(51) Int. Cl.[7] ...................................................... G09G 1/04
(52) U.S. Cl. ...................... 315/370; 315/368.13; 348/806
(58) Field of Search ................................... 315/370, 371, 315/364, 368.11, 368.12, 368.13, 367, 399, 411; 348/807, 806

(56) References Cited

U.S. PATENT DOCUMENTS

| | | | |
|---|---|---|---|
| 4,672,275 | 6/1987 | Ando .................................... | 315/368 |
| 4,689,526 | 8/1987 | Schweer ............................... | 315/371 |
| 5,272,421 | * 12/1993 | Kimura et al. ................... | 315/368.12 |
| 5,398,083 | * 3/1995 | Tsujihara et al. .................... | 348/807 |
| 5,576,774 | * 11/1996 | Hosoi et al. ......................... | 348/745 |
| 5,694,181 | * 12/1997 | Oh ........................................ | 348/807 |
| 5,793,447 | * 8/1998 | Fujiwara et al. ..................... | 348/807 |
| 5,943,382 | * 8/1999 | Li et al. ............................... | 375/376 |
| 6,023,491 | * 2/2000 | Saka et al. ........................... | 375/326 |

* cited by examiner

Primary Examiner—Seungsook Ham

(74) Attorney, Agent, or Firm—Samuels, Gauthier & Stevens, LLP

(57) ABSTRACT

A digital deflection processing apparatus and method for a cathode ray tube are suitable for digitally and programmably correcting distortion in the cathode ray tube. The apparatus includes a synchronous signal and clock signal generating portion for generating a first composite synchronous signal extracted from a composite video broadcast signal or a third composite synchronous signal selected from not less than one second composite synchronous signals. A synchronous signal phase compensating portion lags or leads the phase of the third composite synchronous signal, and outputs the lagged or led third composite synchronous signal as a deflection composite synchronous signal. A coordinate value generating portion operates predetermined values with a result counted by the deflection composite synchronous signal, and outputs the operation result as X and Y axis coordinate values. A horizontal drive signal generating portion determines rising and falling edges of a horizontal drive signal using a phase difference between a fly back pulse and the horizontal drive signal, a deflection horizontal synchronous signal, a horizontal correcting signal, and a predetermined duty value. An interpolation value calculating portion calculates the interpolation values of X and Y axes coordinate values using distortion correcting functions calculated by a time division method in response to selection signals, and outputs the calculated interpolation values as a horizontal correct signal, a dynamic focus signal, a vertical sawtooth drive signal, or an east-west distortion compensation signal. An output adjusting portion adjusts the gains of the vertical sawtooth drive signal and the east-west distortion compensation signal using predetermined values and the electric high tension of a cathode ray tube. A controlling portion outputs a synchronous control signal and predetermined values.

41 Claims, 19 Drawing Sheets

US 6,208,092 B1

APPARATUS AND METHOD FOR DIGITAL DEFLECTION PROCESSING

BACKGROUND OF THE INVENTION

In conventional cathode ray tube deflection processing, analog signals are used to control the current provided to a deflection coil and to control the voltage applied to a focus grid. However, the analog technique is limited by a distortion phenomenon generated in an irregular shape due to flattening of the screen of the cathode ray tube (CRT) and generated by a deflection yoke coil. Control of such phenomena is complicated and difficult to fine tune. A plurality of control terminals are required in order to elaborately and minutely correct the distortion phenomenon. In addition, a well-known phenomenon referred to as north-south (NS) pincushion distortion is uncorrectable, and an additional tilt correcting coil is required for correcting tilt.

Furthermore, in conventional analog deflection devices, electric high tension (EHT) is evenly maintained regardless of the amount of beam in order to correct distortion due to the EHT fluctuation, resulting in increased manufacturing expenses.

In computer CRT applications, the frequencies of horizontal and vertical synchronous signals provided to the cathode ray tube can vary over a wide range. For example, the frequency of the horizontal synchronous signal input to the deflection processing device can vary from 15 kHz to 120 kHz, according to the video output mode of the computer, for example VGA mode or SGA mode. Processing of signals over such a wide range is hardware intensive. Moreover, when the frequencies of horizontal synchronous signals vary over a wide range, a Moire phenomenon is produced, in which the colors of the displayed screen spread like a wave.

SUMMARY OF THE INVENTION

The present invention is directed to a deflection processing device for a cathode ray tube, employed for example in a television set, an oscilloscope, a character display unit, or an image display unit. In particular, the present invention is directed to a digital deflection processing device and method for digitally processing the deflection of the cathode ray tube, in a manner which addresses the limitations of conventional techniques.

It is a first object of the present invention to provide a digital deflection processing device for a cathode ray tube for digitally and programmably correcting distortion.

It is a second object of the present invention to provide a phase difference detector in a digital deflection processing device for a cathode ray tube for precisely detecting the phase difference between a reference signal synchronized with a system clock signal and a comparison signal asynchronous with respect to the system clock signal.

It is a third object of the present invention to provide an apparatus and method for stabilizing the jitter of a synchronous signal in a digital deflection processing device for the cathode ray tube.

It is a fourth object of the present invention to provide a method for calculating an interpolation value with respect to X and Y axis coordinate values, performed in the digital deflection processing device for the cathode ray tube.

It is a fifth object of the present invention to provide an interpolation value calculating device for performing the interpolation value calculating method of the fourth object.

To achieve the first object, a digital deflection processing apparatus comprises synchronous and clock signal generating unit for selecting either a first composite synchronous signal extracted from a composite video broadcasting signal or at least one externally-generated second composite synchronous signal in response to a synchronous control signal, outputting the selected signal as a third composite synchronous signal, and generating a main clock signal; synchronous signal phase converting unit for lagging or leading the phase of the third composite synchronous signal corresponding to a first predetermined value and outputting the lagged or lead third composite synchronous signal as a deflection composite synchronous signal comprising a deflection synchronous signal and a deflection vertical synchronous signal; coordinate value generating unit for performing counting, synchronized with the deflection composite synchronous signal, operating the counting result with second predetermined values, and outputting the operation result as the X and Y axis coordinate values of the beam; selection signal generating unit for processing the counting result to generate first through Eth selection signals; horizontal drive signal generating unit for determining the rising and falling edges of a horizontal drive signal using a phase difference between a fly back pulse and the horizontal drive signal, the deflection horizontal synchronous signal, the horizontal correcting signal, and a predetermined duty value; interpolation value calculating unit for calculating distortion correcting functions 8 F(X) through F(Y)], for example by the time division method, in response to the first through Eth selection signals, calculating the respective interpolation values of the X and Y axis coordinate values using the distortion correcting functions, and outputting the calculated interpolation values as the horizontal correct signal, a dynamic focus signal, a vertical sawtooth drive signal, or an east-west distortion compensation signal EWI, according to the relationship:

$$F(X)=s_0 f_0(X)+s_1 f_1(X)+ \ldots +s_n f_n(X)$$

$$F(Y)=s_0 f_0(Y)+s_1 f_1(Y)+ \ldots +s_n f_n(Y)$$

wherein, $S_0$ through $S_n$ represent seed values and $f_0(X)$ through $f_0(X)$ and $f_n(X)$ through $f_n(Y)$ represent lagrange functions; output adjusting unit for adjusting the gains of the vertical sawtooth drive signal and the EW1 signal using a voltage obtained by distributing the electric high tension (EHT) of the cathode ray tube, a corresponding value among second predetermined values, and third predetermined values and outputting the vertical sawtooth drive signal and the EW1 the gains of which are adjusted; and controlling unit for outputting the synchronous control signal, the seed values, the second predetermined values, and the third predetermined values.

The third composite synchronous signal preferably comprises a third horizontal synchronous signal and a third vertical synchronous signal and the main clock signal is preferably output to the synchronous signal phase converting unit, the coordinate value generating unit, the selection signal generating unit, the horizontal drive signal generating unit, the interpolation value calculating unit, and the output adjusting unit.

To achieve the second object, a phase difference detecting apparatus is provided in a digital deflection processing apparatus for a cathode ray tube for digitally performing deflection processing. The apparatus preferably comprises precise phase difference detecting unit for dividing a period of the system clock signal into N sections, where N is an integer not less than 2, detecting a section to which an asynchronous comparison signal is input among the N divided sections, and outputting the value assigned to the detected section as the decimal value of a phase difference between a reference signal synchronized with the system clock signal and the comparison signal; second phase difference detecting unit for detecting the integer value of the phase difference using the system clock signal and the reference signal, and outputting the decimal and the integer value in response to the system clock signal and the comparison signal; and a loop filter for stabilizing the jitter of the integer value using the filtered decimal value and outputting the integer value, the jitter of which is stabilized and which is filtered, as the phase difference.

To achieve the third object, a digital deflection processing apparatus for a cathode ray tube is provided, having a counter for performing counting in response to a counting signal and being reset in response to a synchronous signal the jitter of which is stabilized. The apparatus comprises a window forming portion for outputting the maximum values and the minimum values of standard, increase, and decrease windows formed corresponding to the values TK counted by the counter, where $1 \leq K \leq i$, and i is an integer not less than 2 and a counted value having smaller K is more recent one; a mode determining portion for comparing the maximum and minimum values with the point of time at which the synchronous signal is generated and determining a mode corresponding to the comparison result; and a synchronous signal generating portion for generating the synchronous signal the jitter of which is stabilized corresponding to the determined mode, for digitally performing deflection processing using the main clock signal, methods according to the present invention for stabilizing the jitter of a synchronous signal are a window forming method, a mode determining method, and a method of generating a synchronous signal having a stabilized jitter.

The window forming method according to the present invention, performed in the window forming portion preferably comprises the steps of: determining a maximum value Tmax and a minimum value Tmin among the counted values; obtaining a subtraction value by subtracting the minimum value Tmin from the maximum value Tmax; subtracting a result obtained by dividing the subtraction value by a first predetermined number from the minimum value Tmin; adding the result obtained by dividing the subtraction value by the first predetermined number to the maximum value Tmax; determining the subtraction and addition results as the minimum value Wmin and the maximum value Wmax of the standard window, respectively; determining the Wmin as the maximum value Wmax' of the decrease window, determining a second predetermined number as the minimum value Wmin' of the decrease window, and determining third and fourth predetermined numbers, respectively, as the maximum value Wmax" and the minimum value Wmin" of the increase window.

The mode determining method according to the present invention, performed by the mode determining portion preferably comprises the steps of: judging whether the synchronous signal the jitter of which is not stabilized is detected not less than first predetermined number of times in the standard window; determining the mode as a standard mode when the synchronous signal the jitter of which is not stabilized is detected not less than the first predetermined number of times in the standard window, judging whether the synchronous signal the jitter of which is not stabilized is dropped out not less than second predetermined times in at least one among the standard, increase, and decrease windows when the synchronous signal the jitter of which is not stabilized is not detected not less than the first predetermined times in the standard window, determining the mode as a no signal mode when the synchronous signal the jitter of which is not stabilized is dropped out in at least one among the windows not less than second predetermined times, and determining the mode as a non-standard mode when the synchronous signal the jitter of which is not stabilized is not dropped out the second predetermined number times in all windows.

The synchronous signal generating method for generating the synchronous signal the jitter of which is stabilized from the synchronous signal generating portion preferably comprises the steps of determining whether the mode is the standard mode, determining the signal having the most recently counted value as a period as the synchronous signal the jitter of which is stabilized when the mode is the standard mode, judging whether the mode is the no signal mode when the mode is not the standard mode, generating by itself the synchronous signal the jitter of which is stabilized when the mode is the no signal mode, determining whether the synchronous signal the jitter of which is not stabilized is detected in the standard window when the mode is not the no signal mode, determining whether the synchronous signal the jitter of which is not stabilized is detected is the decrease window when the synchronous signal the jitter of which is not stabilized is not detected is the standard window, generating by itself the synchronous signal the jitter of which is stabilized when the synchronous signal the jitter of which is not stabilized is not detected in the decrease window, and determining the synchronous signal the jitter of which is not stabilized as the synchronous signal the jitter of which is stabilized when the synchronous signal the jitter of which is not stabilized is detected in the standard window or the decrease window.

To achieve the fourth object, an interpolation value calculating method performed in the interpolation value calculating portion included in a digital deflection apparatus for a cathode ray tube, for calculating the interpolation values of the X and Y axes coordinate values (X and Y) of a beam using distortion correcting functions [F(X) and F(Y)] preferably comprising the steps of restricting the size of the X and Y axes coordinate values, obtaining lagrange functions $[f_0(X)$ through $f_n(X)$ and $f_0(Y)$ through $f_n(Y)]$ which is a nth order polynomial with respect to the X and Y axes coordinate values the sizes of which are restricted, by a time division method, determining whether the seed values $s_0$ through $s_n$ of a currently scanned line are given from the outside, obtaining the seed values of the line inside when the seed values are not given from the outside, obtaining the distortion correcting functions [F(X) and F(Y)] as follows using the seed values and the lagrange functions, and $$F(X)=s_0f_0(X)+s_1f_1(X)+ \ldots +s_nf_n(Y)$$

$$F(Y)=s_0f_0(Y)+s_1f_1(Y)+ \ldots +s_nf_n(X)$$

calculating the interpolation values with respect to the X and Y by substituting the X and Y for the distortion correcting functions.

To achieve the fifth object, in an interpolation value calculating apparatus of a digital deflection processing apparatus for a cathode ray tube, the sizes of the coordinate values (X and Y) of the X and Y axes of beam are restricted, lagrange functions are preferably calculated by operating X and Y having restricted sizes, subsequent distortion correcting functions [F(X) and F(Y)] are preferably calculated using the lagrange functions, and the interpolation values with respect to X and Y are preferably calculated by substituting X and Y having restricted sizes for the distortion correcting functions.

$$F(X)=s_0f_0(X)+s_1f_1(X)+ \ldots +s_nf_n(Y)$$

$$F(Y)=s_0f_0(Y)+s_1f_1(Y)+ \ldots +s_nf_n(X)$$

[wherein, $s_0$ through $S_n$ are seed values and $f_0(X)$ through $f_n(X)$ and $f_0(Y)$ through $f_n(Y)$ are lagrange functions.]

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Hereinafter, a digital deflection processing device according to the present invention and the structures and operations of the embodiments thereof will be described as follows with reference to the attached drawings.

Figure 1:
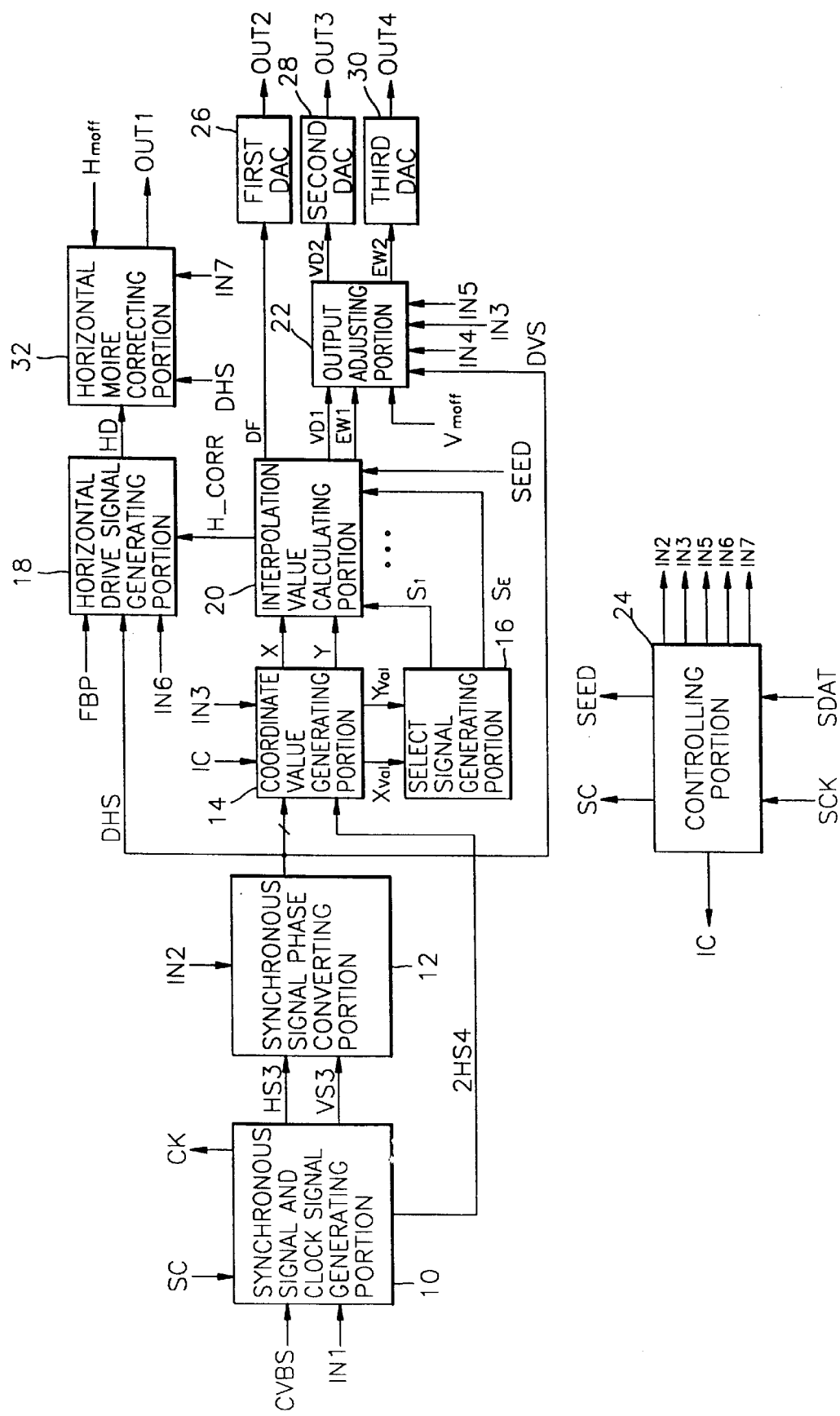
FIG. 1 is a block diagram of a digital deflection processing device for a cathode ray tube according to the present invention.

FIG. 1 is a block diagram of a digital deflection processing device for a cathode ray tube according to the present invention. The device includes a synchronous signal and clock signal generating portion 10, a synchronous signal phase converting portion 12, a coordinate value generating portion 14, a selection signal generating portion 16, a horizontal drive signal generating portion 18, an interpolation value calculating portion 20, an output adjusting portion 22, a controlling portion 24, first, second, third digital/analog converters 26, 28, and 30, and a horizontal Moire correcting portion 32.

The synchronous signal and clock signal generating portion 10 shown in FIG. 1 selects either a first composite synchronous signal extracted from a composite video bandwidth signal (CVBS) input via an antenna or at least one second composite synchronous signal input from an external circuit through an input terminal IN1 in response to a synchronous control signal (SC) and outputs the selected composite synchronous signal as a third composite synchronous signal. The second composite synchronous signal is separated into horizontal and vertical synchronous signals. The synchronous signal and clock signal generating portion 10 stabilizes the jitter of the third composite synchronous signal separated into a third horizontal synchronous signal HS3 and a third vertical synchronous signal VS3 and outputs the result.

The synchronous signal and clock signal generating portion 10 further provides, to the respective portions shown in FIG. 1, a main clock signal (CK) extracted from the CVBS or generated using an external clock signal (EX_CK) input through an input terminal IN1, as mentioned below.

The structures and operations of the embodiments according to the present invention of the synchronous signal and clock signal generating portion 10 shown in FIG. 1 will now be described.

Figure 2:
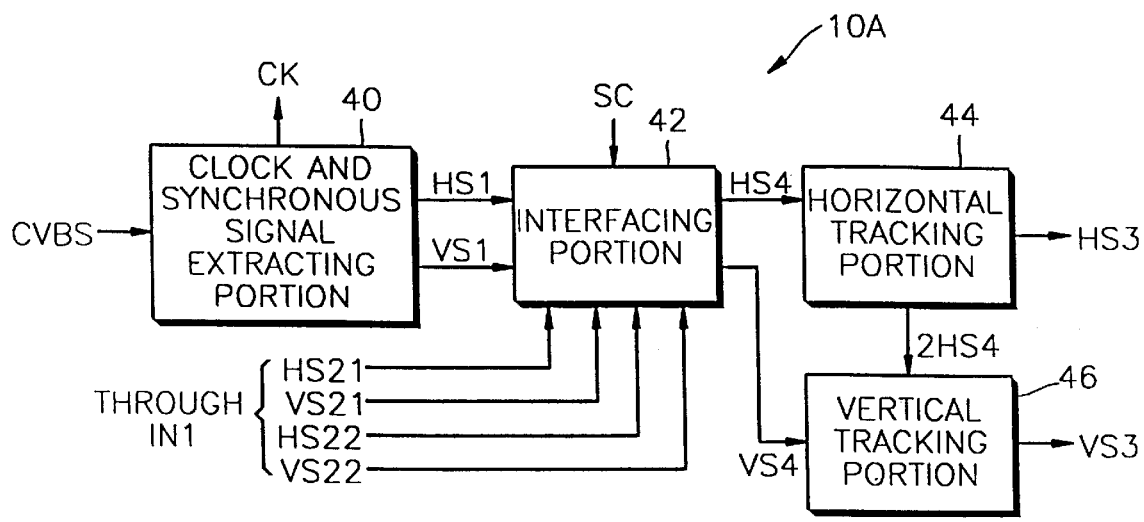
FIG. 2 is a block diagram of a preferred embodiment of the present invention of a synchronous signal and clock signal generating portion shown in FIG. 1.

FIG. 2 is a block diagram of a preferred embodiment 10A according to the present invention of the synchronous and clock signal generating portion 10 shown in FIG. 1. The synchronous signal and clock signal generating portion includes a clock and synchronous signal extracting portion 40, an interfacing portion 42, and horizontal and vertical tracking portions 44 and 46.

The clock and synchronous signal extracting portion 40 shown in FIG. 2 extracts the main clock signal (CK), the first horizontal synchronous signal (HS1), and a first vertical synchronous signal (VS1) using the CVBS. At this time, the separate first and second horizontal synchronous signals are referred to as a first composite synchronized signal.

Figure 3:
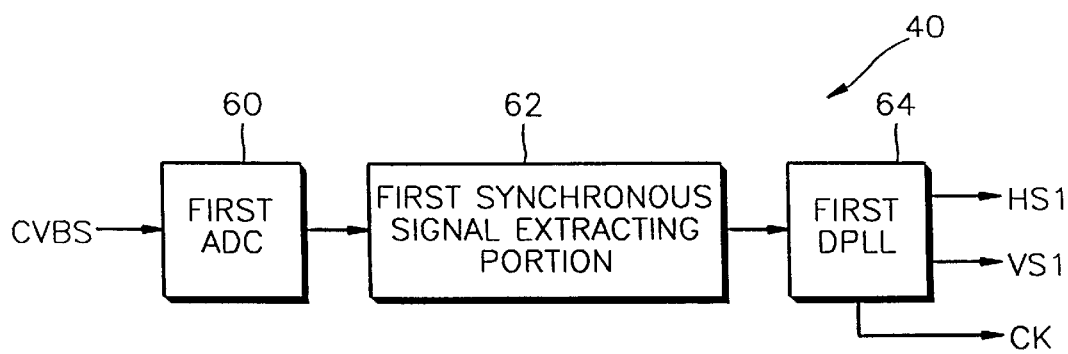
FIG. 3 is a block diagram according to the present invention of a clock and synchronous signal extracting portion shown in FIG. 2.

FIG. 3 is a block diagram of the clock and synchronous signal extracting portion 40 shown in FIG. 2. The clock and synchronous signal extracting portion includes a first analog to digital converter (ADC) 60, a first synchronous signal extracting portion 62, and a first digital phase-locked-loop (DPLL) 64.

The first ADC 60 shown in FIG. 3 having an automatic gain control function converts the analog CVBS into a digital signal. A first synchronous signal extracting 62 extracts the horizontal and vertical synchronous signals included in the digital CVBS signal. A first DPLL 64 includes a phase detector (not shown), a discrete time oscillator (DTO) (not shown), and a jitter reducer (not shown) for reducing the jitter of the signal output from the DTO, etc. The first DPLL 64 stabilizes the jitter of the horizontal and vertical synchronous signals extracted from the first synchronous signal extracting portion 62, for example, within 1 ns, and outputs the horizontal and vertical synchronous signals, the jitter of which is stabilized, to the interfacing portion 42 shown in FIG. 2 as the first horizontal and vertical synchronous signals (HS1 and VS1). Also, the first DPLL 64 outputs the main clock signal (CK), the period of which is an integer multiple of a period of the first horizontal synchronous signal (HS1). Here, the frequency of the main clock signal can be 27 MHz.

The interfacing portion 42 shown in FIG. 2 selects a horizontal synchronous signal and a vertical synchronous signal among the first horizontal and vertical synchronous signals (HS1 and VS1) input from the clock and synchronous signal extracting portion 40, two horizontal synchronous signals HS21 and HS22, and two second vertical synchronous signals VS21 and VS22 input from an external circuit through the input terminal IN1 in response to the synchronous control signal (SC) output from the controlling portion 24 and outputs the selected horizontal and vertical synchronous signals to the horizontal and vertical tracking portions 44 and 46 as fourth horizontal and vertical synchronous signals (HS4 and VS4), respectively.

The second horizontal synchronous signal HS21 and the second vertical synchronous signal VS21 may be synchronous signals included in a digital image signal input through a communication cable by the standard format CCIR656. Also, the second horizontal synchronous signal HS22 and the second vertical synchronous signal VS22 may be used as synchronous signals for a digital image signal which is input through the communication cable by the format CCIR601 and does not include synchronous signals.

Figure 4:
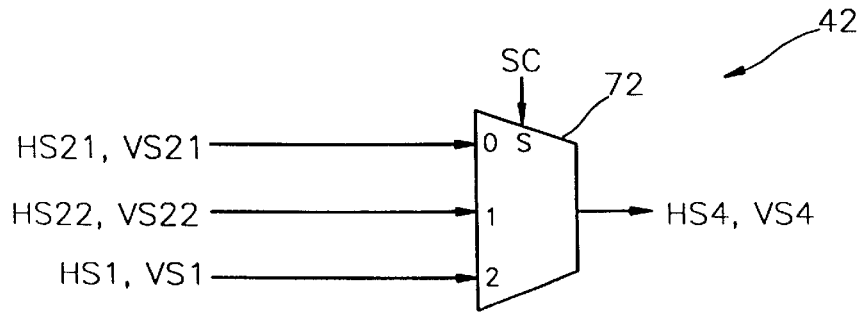
FIG. 4 is a schematic diagram of an interfacing portion shown in FIG. 2.

FIG. 4 is a general block diagram of the interfacing portion 42 shown in FIG. 2.

A multiplexer 72 of the interfacing portion 42 shown in FIG. 4 selects a horizontal synchronous signal and a vertical synchronous signal among the second horizontal synchronous signals HS21 and HS22, the second vertical synchronous signals V21 and V22, and the first horizontal and vertical synchronous signals HS1 and VS1 in response to the synchronous control signal SC and outputs the selected horizontal and vertical synchronous signals to the horizontal tracking portion 44 and the vertical tracking portion 46 as the fourth horizontal and vertical synchronous signals HS4 and VS4. At this time, a format converter (not shown) can be loaded into the interfacing portion 42 shown in FIG. 4. The loaded format converter (not shown) extracts the second horizontal and vertical synchronous signals HS21 and VS21 from the digital image signal of the format CCIR656 and outputs the extracted synchronous signals to the multiplexer 72.

The first horizontal and vertical synchronous signals HS1 and VS1 are output from the clock and synchronous signal extracting portion 40, with the jitter stabilized. However, the jitter of the second horizontal synchronous signals HS21 and HS22 and the second vertical synchronous signals VS21 and VS22 are not stabilized. Therefore, the horizontal and vertical tracking portions 44 and 46 shown in FIG. 2 generate by itself horizontal and vertical synchronous signals or remove noise when the fourth horizontal and vertical synchronous signals are dropped out, include noise, or do not exist. Namely, the horizontal tracking portion 44 stabilizes the jitter of the fourth horizontal synchronous signal HS4 input from the interfacing portion 42 in response to the main clock signal (CK) and outputs the fourth horizontal synchronous signal. The vertical tracking portion 46 stabilizes the jitter of the fourth vertical synchronous signal (VS4) input from the interfacing portion 42 in response to a signal 2HS4 having a period twice the period of the fourth horizontal synchronous signal HS4.

Figure 5:
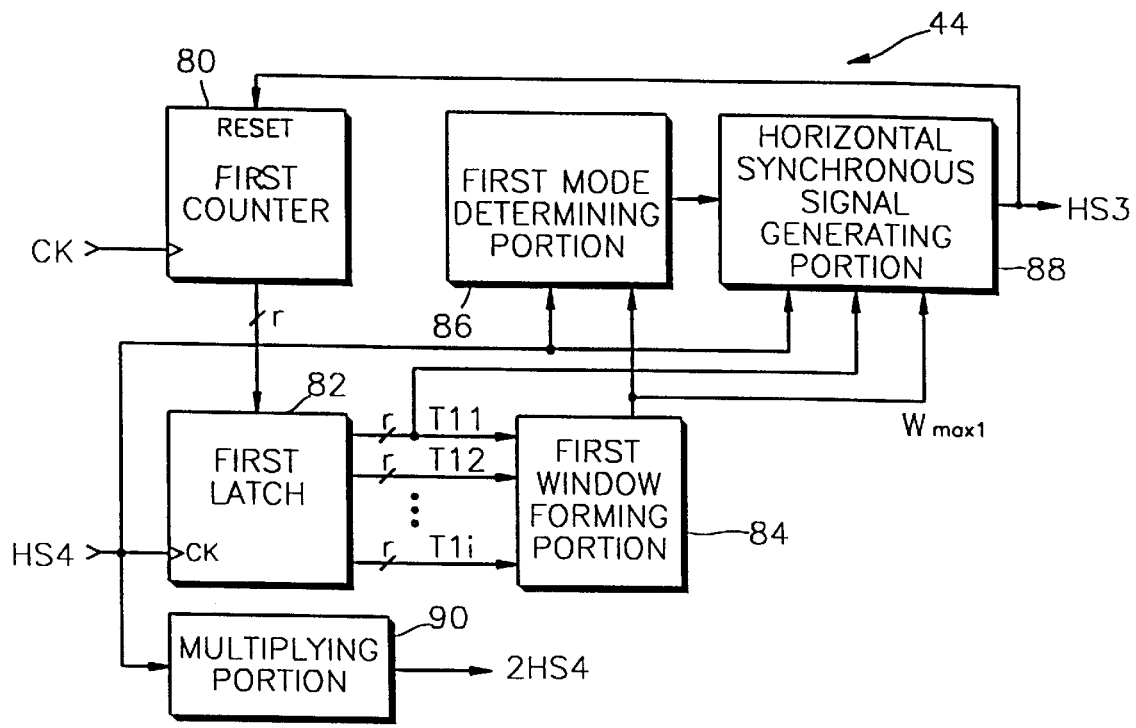
FIG. 5 is a block diagram according to the present invention of a horizontal tracking portion shown in FIG. 2.

FIG. 5 is a block diagram according to the present invention of the horizontal tracking portion 44 shown in FIG. 2. The horizontal tracking portion includes a first counter 80, a first latch 82, a first window forming portion 84, a first mode determining portion 86, a horizontal synchronous signal generating portion 88, and a frequency multiplying portion 90.

Figure 6:
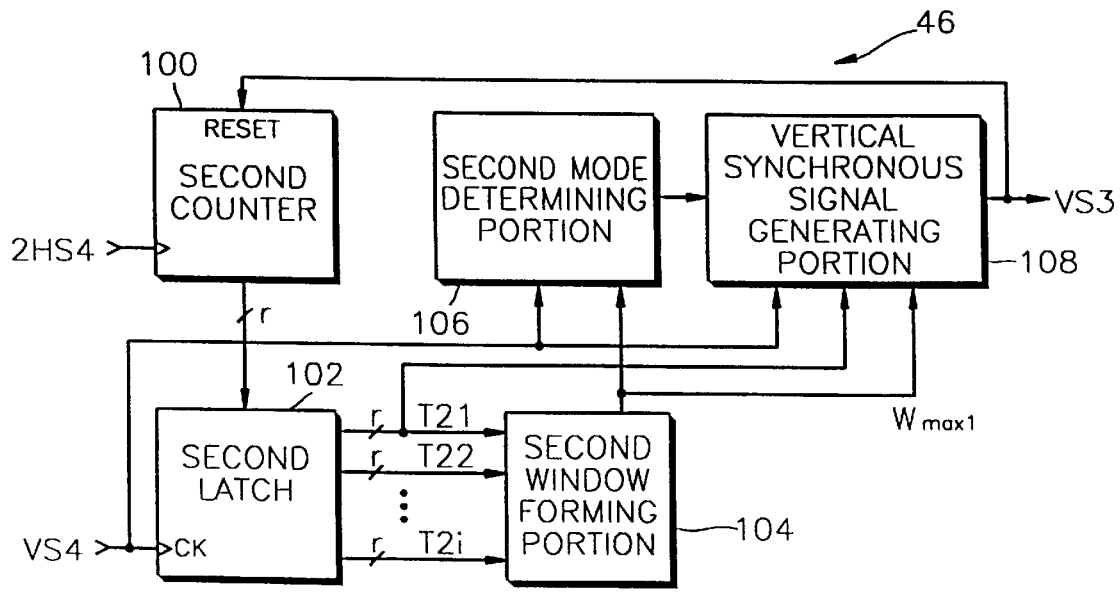
FIG. 6 is a block diagram according to the present invention of a vertical tracking portion shown in FIG. 2.

FIG. 6 is a block diagram according to the present invention of the vertical tracking portion 46 shown in FIG. 2. The vertical tracking portion includes a second counter 100, a second latch 102, a second window forming portion 104, a second mode determining portion 106, and a vertical synchronous signal generating portion 108.

The first counter 80 shown in FIG. 5 performs counting in response to the main clock signal (CK) input to a clock terminal and is reset in response to the third horizontal synchronous signal HS3 the jitter of which is stabilized, input to a reset terminal (RESET), and outputs a counted value of r bits to the first latch 82. The first counter 80 can be realized as a pixel counter. In general, the pixel counter counts the number of pixels existing in a period of the horizontal synchronous signal. The first latch 82 latches the counted value output from the first counter 80 in response to the fourth horizontal synchronous signal HS4 and outputs the latched r bits of counted value T1K ($1 \leq K \leq i$, i is an integer not less than 2) to the first window forming portion 84. Here, as K is smaller, the T1K represents a recently counted value. At this time, the frequency multiplying portion 90 of the horizontal tracking portion 44 doubles the frequency of the HS4 input from the interfacing portion 42 and outputs the signal (2HS4) having the doubled frequency to the vertical tracking portion 46.

The second counter 100 shown in FIG. 6 performs counting in response to the 2HS4 input to the clock terminal, is reset in response to the third vertical synchronous signal VS3 the jitter of which is stabilized, input from the reset terminal RESET, and outputs the r bits of counted value to the second latch 102. Here, the second counter 100 can be realized as a line counter. In general, the line counter counts how many lines, i.e. horizontal synchronous signals, exist in a period of the vertical synchronous signal. The second latch 102 latches the counted value output from the second counter 100 in response to the fourth vertical synchronous signal VS4 and outputs the latched r bits of counted values T2K ($1 \leq K \leq i$, i is an integer not less than 2) to the second window forming portion 104.

Here, the operation of the first window forming portion 84, the first mode determining portion 86, and the horizontal synchronous signal generating portion 88 shown in FIG. 5 are the same as those of the second window forming portion 104, the second mode determining portion 106, and the vertical synchronous signal generating portion 108 shown in FIG. 6. Therefore, only the first window forming portion 84, the first mode determining portion 86, and the horizontal synchronous signal generating portion 88 shown in FIG. 5 will be described as follows.

The first window forming portion 84 outputs to the first mode determining portion 86 the maximum values Wmax1, Wmax1', and Wmax1" and the minimum values Wmin1, Wmin1', and Wmin1" of a first standard window, a first decrease window, and a first increase window formed corresponding to the counted values T11, T12, . . . , and T1i output from the first latch 82 which can be realized using i-stage registers (where i is an integer not less than 2).

The window forming method according to the present invention by which the first window forming portion 84 forms the above-mentioned windows is described as follows.

Figure 7:
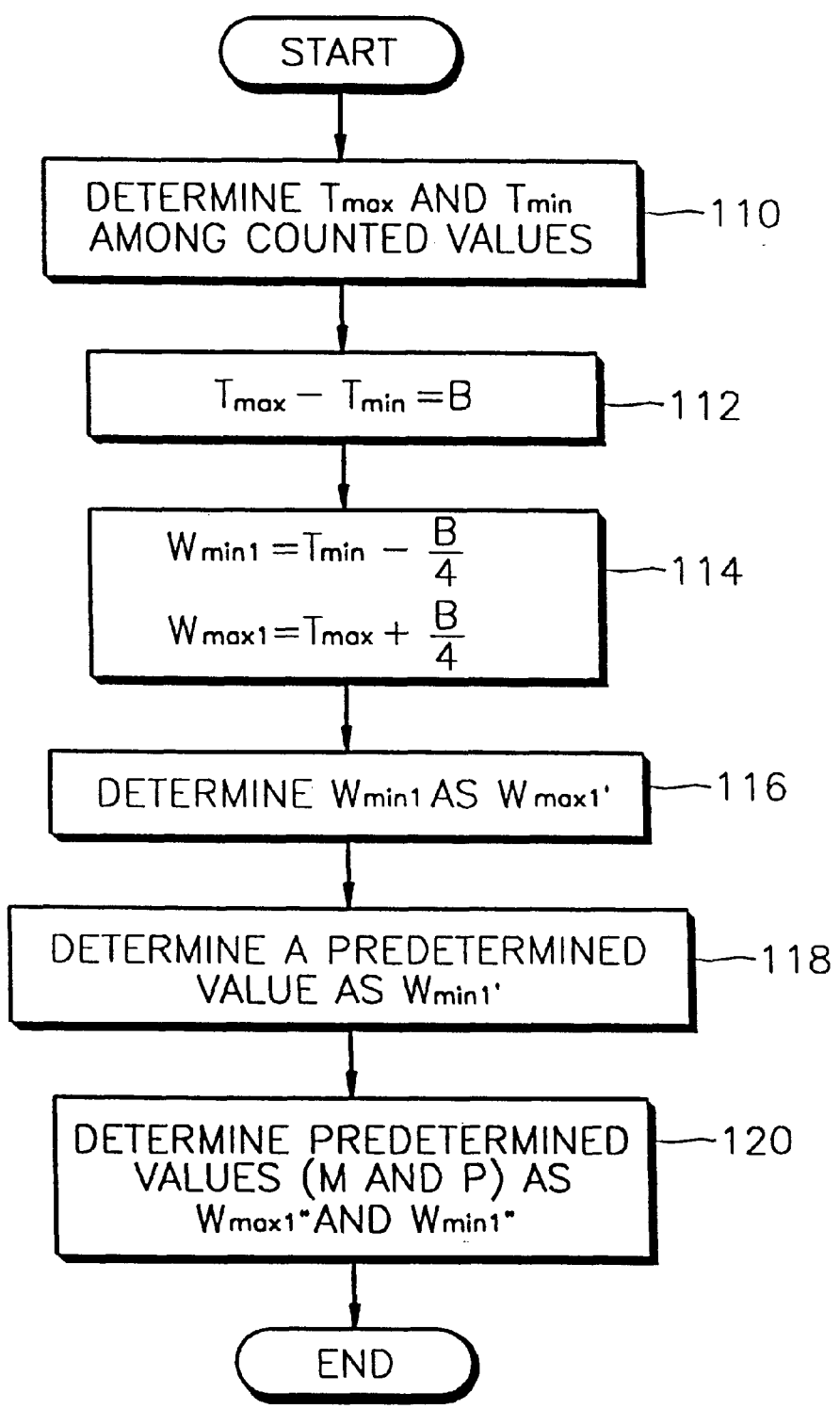
FIG. 7 is a flow diagram for describing a window forming method according to the present invention, performed, for example, in a first window forming portion shown in FIG. 5.

FIG. 7 is a flowchart for describing the window forming method according to the present invention, performed by the first window forming portion 84 shown in FIG. 5. The method includes the steps of forming the first standard window (steps 110 through 114), forming the first decrease window (steps 116 and 118), and forming the first increase window (step 120).

Referring to FIG. 7, the first window forming portion 84 determines the maximum value Tmax and the minimum value Tmin among the counted values T11, T12, . . . , and T1i input from the first latch 82 (step 110). After the step 110, a difference value (B) is obtained by subtracting the minimum value Tmin from the maximum value Tmax (step 112). After the step 112, the minimum value Wmin1 of the first standard window is obtained by subtracting the value obtained by dividing the difference value (B) by a predetermined value, for example, 4 from the minimum value Tmin, and the maximum value Wmax1 of the first standard window is obtained by adding the value obtained by dividing B by 4 to the maximum value Tmax as represented by (step 114):

$$W_{\min}1 = T_{\min} - \frac{B}{4} \tag{1}$$

$$W_{\max}1 = T_{\max} + \frac{B}{4}$$

After step 114, the minimum value Wmin1 of the first standard window is determined as the maximum value Wmax1' of the first decrease window (step 116). After step 116, a predetermined value (L) is determined as the minimum value (Wmin1') of the first decrease window (step 118). After the step 118, predetermined values M and P are determined as the maximum values and minimum values Wmax1" and Wmin1" of the first increase window, respectively (step 120). Here, for example, the predetermined values L, M, and P may be 1307, 1150, and 0, respectively. However, when the steps 118 and 120 are performed in the second window forming portion 104 shown in FIG. 6, the predetermined values L, M, and P may be, for example, 400, 352, and 0.

The first mode determining portion 86 determines to which window the fourth horizontal synchronous signal HS4 belongs among the windows formed by the first window forming portion 84, using the maximum and minimum values of the respective windows input from the first window forming portion 84, and outputs the first mode signal showing a mode according to the determined result to the horizontal synchronous signal generating portion 88. The mode determining method according to the present invention in which the first mode determining portion 86 determines the mode, is described as follows.

Figure 8:
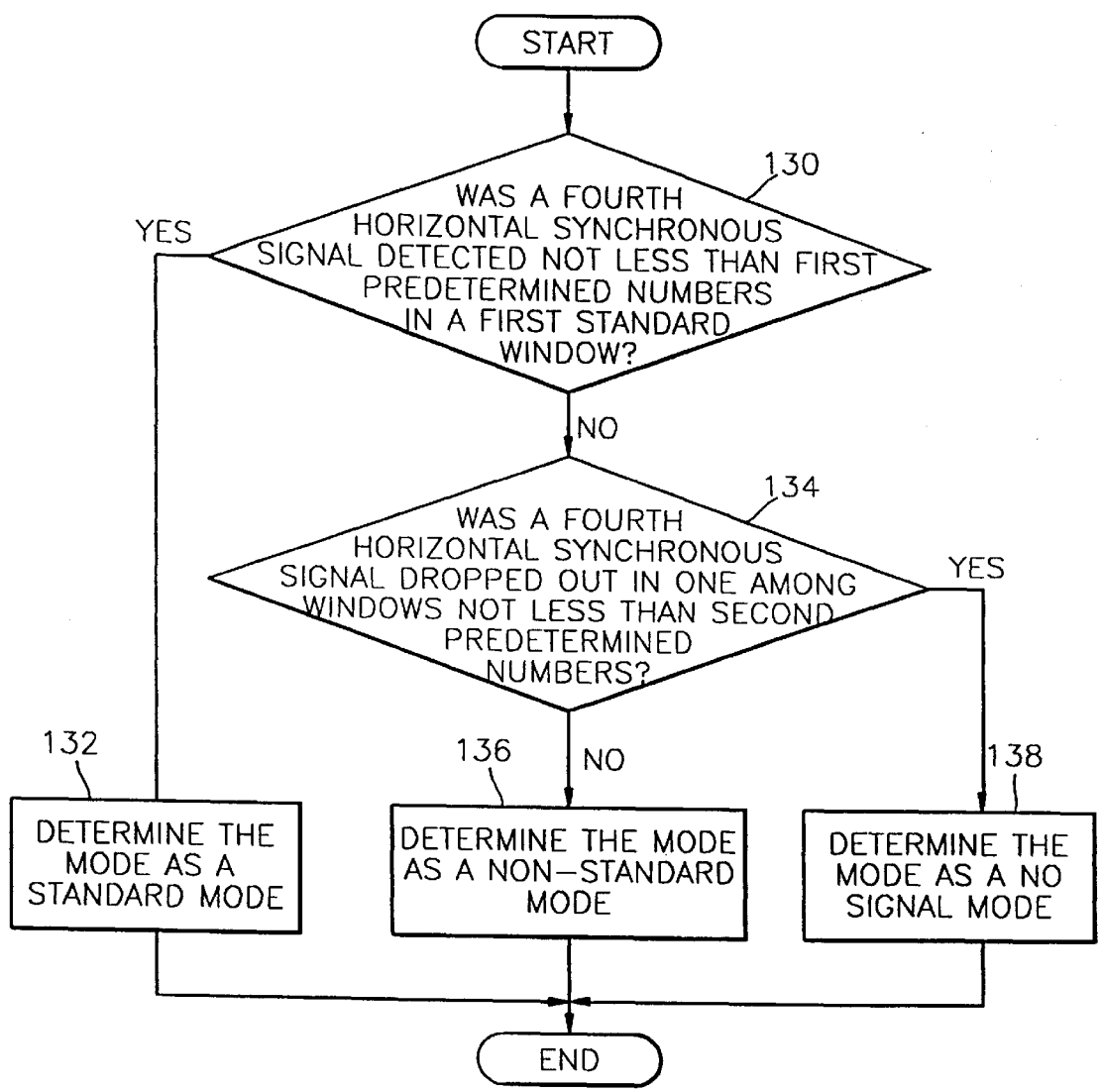
FIG. 8 is a flowchart for describing a mode determining method according to the present invention, performed in a first mode determining portion shown in FIG. 5.

FIG. 8 is a flowchart for describing the mode determining method according to the present invention performed, for example, in the first mode determining portion 86 shown in FIG. 5. The method includes the steps of determining a standard mode, a non-standard mode, and a no signal mode (steps 130 through 138).

Referring to FIG. 8, the first mode determining portion 86 determines whether the fourth horizontal synchronous signal HS4 is detected at least a first predetermined number, for example, eight times in the first standard window (step 130). When the fourth horizontal synchronous signal HS4 is detected not less than eight times in the first standard window, the current mode is determined as the standard mode (step 132). However, when the fourth horizontal synchronous signal HS4 is not detected not less than eight times in the first standard window, it is determined whether the fourth horizontal synchronous signal HS4 is dropped out not less than a second predetermined time, for example, three times in at least one among the first standard window, the first decrease window, and the first increase window (step 134), in which case the current mode is determined as no signal mode (step 138). Otherwise, the current mode is determined as a non standard mode (step 136). As a result, the first mode determining portion 86 outputs the first mode signal representing the mode determined by the above-mentioned method to the horizontal synchronous signal generating portion 88.

The horizontal synchronous signal generating portion 88 shown in FIG. 5 selects a signal generated therein using the most recently counted value T11 output from the first latch 82 at the point of time in which the maximum value Wmax1 of the first standard window is generated, or the fourth horizontal synchronous signal HS4 in response to the first mode signal, and outputs the selected signal as the third horizontal synchronous signal HS3, the jitter of which is stabilized. The synchronous signal generating method according to the present invention in which the third horizontal synchronous signal HS3 is generated from the horizontal synchronous signal generating portion 88 is described as follows.

Figure 9:
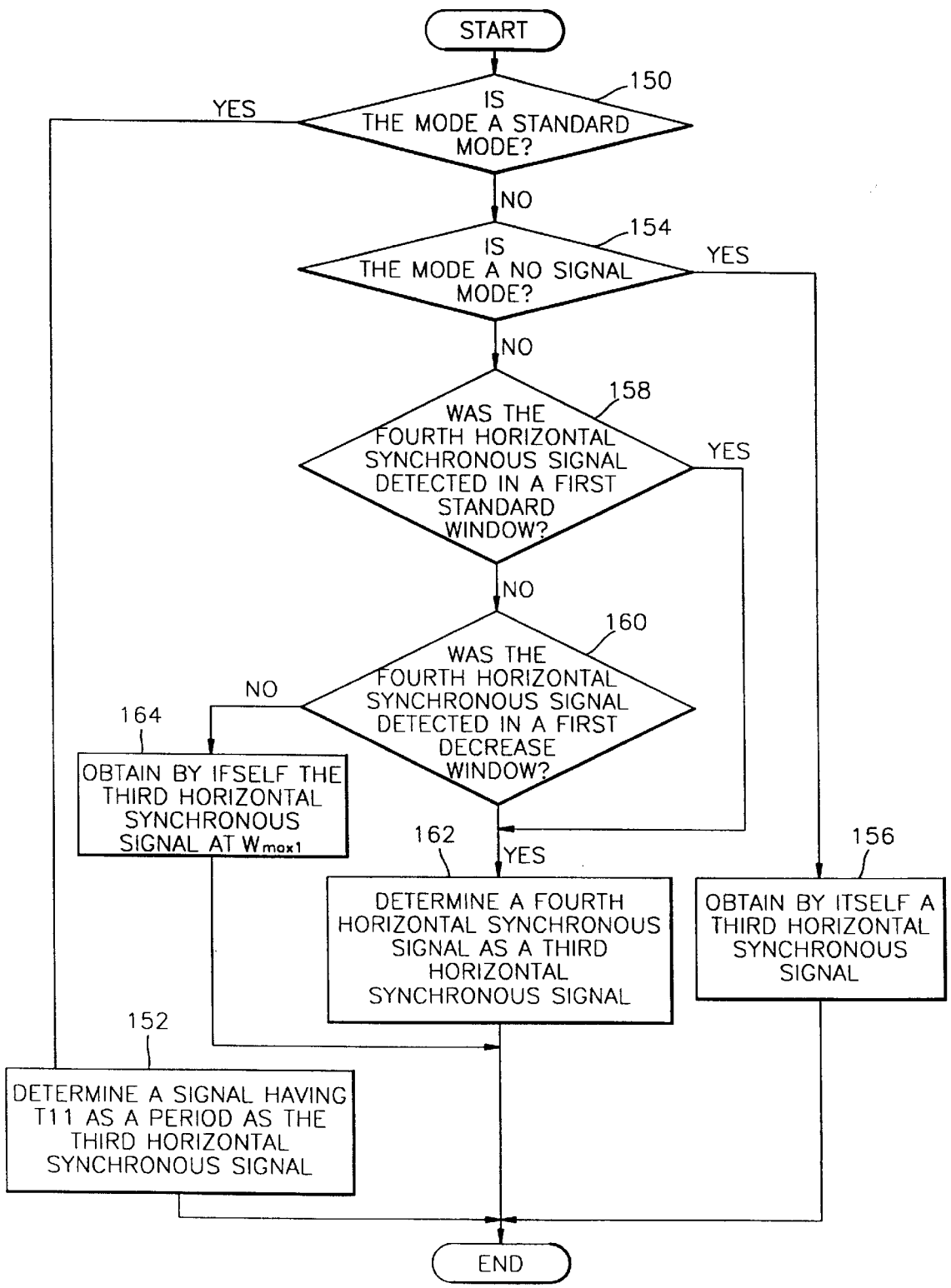
FIG. 9 is a flowchart for describing a synchronous signal generating method according to the present invention, performed in a horizontal synchronous signal generating portion shown in FIG. 5.

FIG. 9 is a flowchart describing the synchronous signal generating method according to the present invention, performed, for example, in the horizontal synchronous signal generating portion 88 shown in FIG. 5. The method includes the steps of generating the third horizontal synchronous signal according to the application of the standard mode, the no signal mode, and the non standard mode (steps 150 through 164).

Referring to FIG. 9, the horizontal synchronous signal generating portion 88 determines whether the current mode is the standard mode from the first mode signal input from the first mode determining portion 86 (step 150). When the current mode is the standard mode, the signal having the most recently counted value T11 as a period is output as the third horizontal synchronous signal, the jitter of which is stabilized (step 152). However, when the current mode is not the standard mode, the horizontal synchronous signal generating portion 88 determines whether the current mode is the no signal mode, from the first mode signal (step 154). When the current mode is the no signal mode, the horizontal synchronous signal generating portion 88 outputs the self-oscillated and generated signal as the third horizontal synchronous signal HS3 the jitter of which is stabilized (step 156). However, when the current mode is not the no signal mode, the horizontal synchronous signal generating portion 88 determines the current mode as the non standard mode and determines whether the fourth horizontal synchronous signal HS4 is detected in the first standard window (step 158). If not, it is determined whether the fourth horizontal synchronous signal HS4 is detected in the first decrease window (step 160). When the fourth horizontal synchronous signal HS4 is not detected in the first decrease window, the self-oscillated signal generated from the maximum value Wmax1 of the first standard window input from the first window forming portion 84 is ouput as the third horizontal synchronous signal the jitter of which is stabilized (step 164). However, when the fourth horizontal synchronous signal HS4 is detected in the first standard window or the first decrease window, the fourth horizontal synchronous signal HS4 input from the interfacing portion 42 is bypassed and output as the third horizontal synchronous signal HS3 (step 162).

FIGS. 7 through 9 can be identically applied to the second window forming portion 104, the second mode determining portion 106, and the vertical synchronous signal generating portion 108 shown in FIG. 6. That is, it is possible to understand the operations of the respective portions 104, 106, and 108 shown in FIG. 6 when T2K instead of T1K is applied, the second maximum values and the second minimum values instead of the first maximum values and the first minimum values are applied, the second mode signal instead of the first mode signal is applied, the second standard window, the second decrease window, and the second increase window instead of the first standard window, the first decrease window, and the first increase window are applied, and the vertical synchronous signal instead of the horizontal synchronous signal is applied.

The synchronous signal and clock signal generating portion 10A shown in FIG. 2 can be usefully applied to the digital deflection device for the cathode ray tube of a television. Namely, it can be advantageously applied when the frequency of the at least one second horizontal synchronous signal input through the input terminal IN1 does not vary over a wide range. However, when the frequencies of the second horizontal and vertical synchronous signals input through the input terminal IN1 vary over a wide range, the synchronous signal and clock signal generating portion 10 shown in FIG. 1 can be implemented by the circuit 10B shown in FIG. 10.

Figure 10:
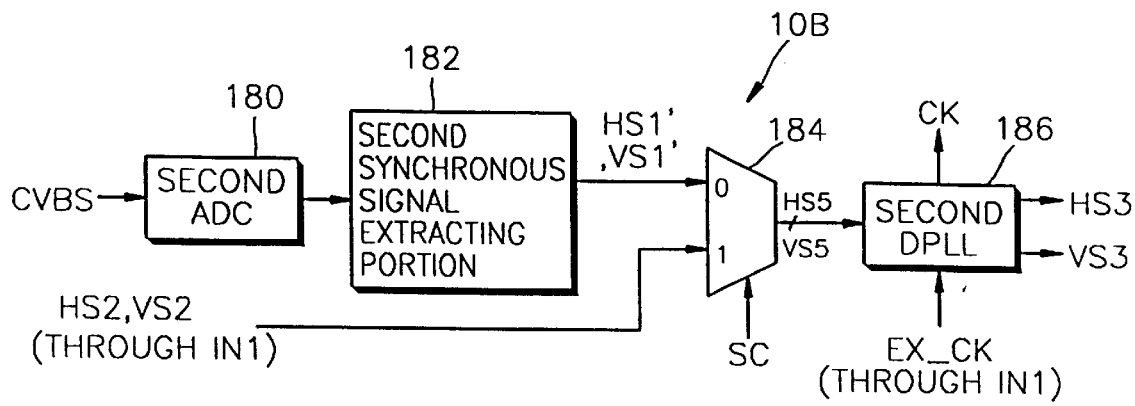
FIG. 10 is a block diagram of an alternative embodiment according to the present invention of a synchronous signal and clock signal generating portion shown in FIG. 1.

FIG. 10 is a block diagram of another embodiment 10B according to the present invention of the synchronous signal and clock signal generating portion 10 shown in FIG. 1. The synchronous signal and clock signal generating portion includes a second ADC 180, a second synchronous signal extracting portion 182, a multiplexer 184, and a second DPLL186.

The second ADC 180 converts the analog CVBS signal into a digital CVBS signal and outputs the converted digital CVBS to the second synchronous signal extracting portion 182. The second synchronous signal extracting portion 182 extracts from the digital CVBS a first composite synchronous signal divided into the first horizontal synchronous signal HS1' and the first vertical synchronous signal VS', and outputs the extracted first composite synchronous signal to the multiplexer 184.

The multiplexer 184 shown in FIG. 10 selects one among the first composite synchronous signals HS1' and VS1' output from the second synchronous signal extracting portion 182 and the second composite synchronous signals, input at a transistor-transistor logic (TTL) level through the input terminal IN1 and divided into the second horizontal synchronous signal HS2 and the second vertical synchronous signal VS2, in response to the synchronous control signal SC output from the controlling portion 24, and outputs the selected signal to the second DPLL 186 as the fifth composite synchronous signal divided into the fifth horizontal synchronous signal HS5 and the fifth vertical synchronous signal VS5.

The second DPLL 186 synchronizes the fifth composite synchronous signals HS5 and VS5 output from the multiplexer 184 with the external clock signal EX_CK input through the input terminal IN1, stabilizes the jitter of the fifth composite synchronous signals synchronized with the external clock signal EX_CK, and outputs the fifth composite synchronous signal the jitter of which is stabilized as the third composite synchronous signals HS3 and VS3. Also, the second DPLL 186 generates the main clock signal CK having a period an integer multiple of the period of the third horizontal synchronous signal HS3.

The structure and operation of the second DPLL 186 shown in FIG. 10 is now described as follows.

Figure 11:
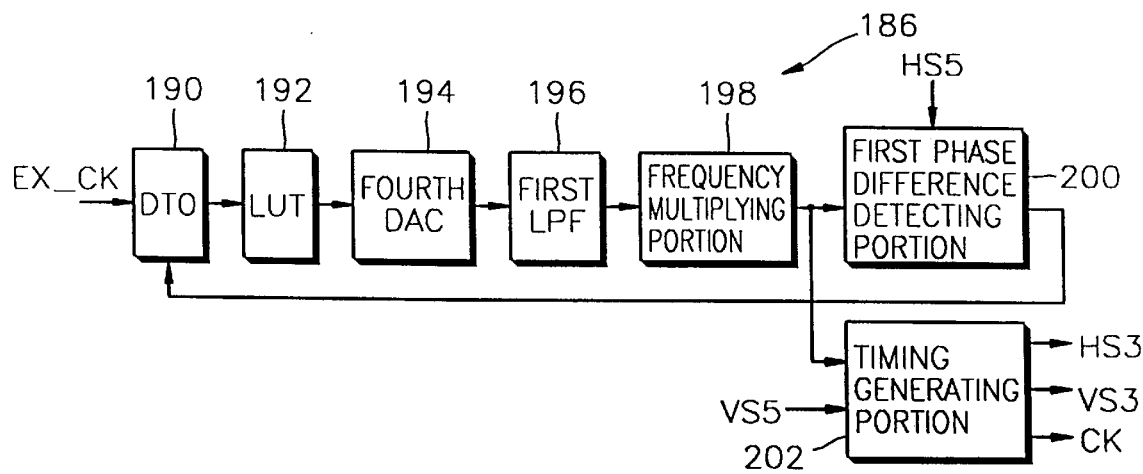
FIG. 11 is a general circuit diagram of a second DPLL shown in FIG. 10.

FIG. 11 is a general circuit diagram of the second DPLL 186 shown in FIG. 10. The second DPLL includes a discrete time oscillator (DTO) 190, a look up table (LUT) 192, a fourth DAC 194, a first low pass filter 196, a frequency multiplying portion 198, a first phase difference detecting portion 200, and a timing generating portion 202.

The DTO 190 shown in FIG. 11 forms a sawtooth value which is increased by integrating the frequency correcting value output from the first phase difference detecting portion 200 in response to the external clock signal $EX_{13}$ CK input as the clock signal through the input terminal IN1 and outputs the formed sawtooth value as the address of the LUT 192. The LUT 192 generates the digital value of the sawtooth waveform stored in the formed sawtooth value input as the address to the fourth DAC 194. The fourth DAC 194 converts the digital value into an analog signal and outputs the converted analog sawtooth signal to the first LPF 196. The first LPF 196, which can be realized by a resistor and a capacitor, removes the noise of the analog sawtooth signal and outputs the sawtooth signal to the frequency multiplying portion 198. The frequency multiplying portion 198 multiplies the frequency of the sawtooth signal removed of the noise to a high frequency and outputs a frequency multiplied signal. The first phase difference detecting portion 200 detects the phase difference between the frequency multiplied sawtooth signal and the fifth horizontal synchronous signal HS5 output from the multiplexer 184 (see FIG. 10) and outputs the detected phase difference to the DTO 190 as the frequency correcting value. At this time, the timing generating portion 202 generates the third horizontal and vertical synchronous signals HS3 and VS3 using the frequency multiplied sawtooth signal and the fifth vertical synchronous signal VS5 output from the multiplexer 184 and generates the main clock signal CK using the third horizontal synchronous signal.

The synchronous signal phase converting portion 12 shown in FIG. 1 lags or leads the phases of the third horizontal and vertical synchronous signals HS3 and VS3, output from the synchronous signal and clock signal generating portion 10 corresponding to the first predetermined value input from the controlling portion 24 through the input terminal IN2, and outputs the lagged or lead third horizontal and vertical synchronous signals HS3 and VS3 as a deflection horizontal synchronous signal DHS and a deflection vertical synchronous signal (DVS), respectively.

The operations and structures of the embodiments according to the present invention of the synchronous signal phase converting portion 12 shown in FIG. 1 are described as follows.

Figure 12:
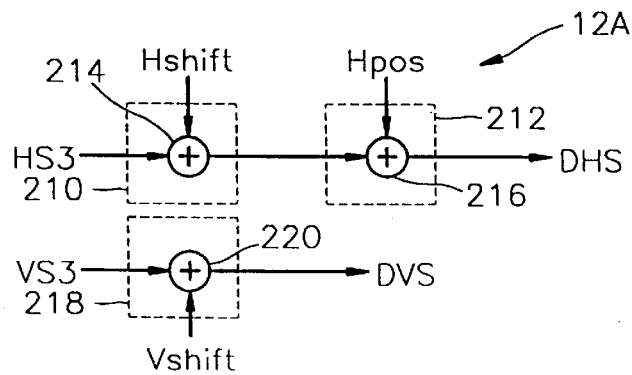
FIG. 12 is a circuit diagram of a preferred embodiment according to the present invention of a synchronous signal phase converting portion shown in FIG. 1.

FIG. 12 is a circuit diagram of a preferred embodiment 12A according to the present invention of the synchronous signal phase converting portion 12 shown in FIG. 1. The synchronous signal phase converting portion 12A is comprised of a horizontal phase compensating portion 210, a horizontal start position determining portion 212, and a vertical phase compensating portion 218.

Figure 13:
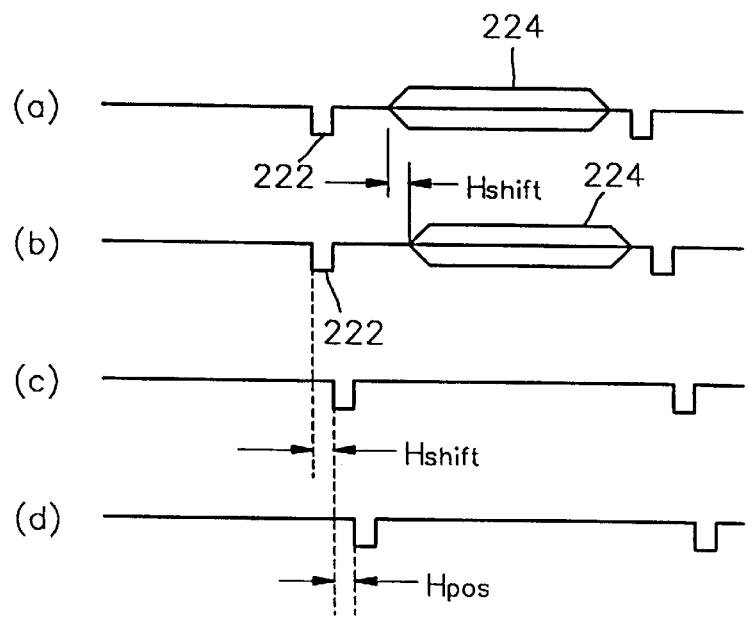
FIGS. 13A through 13D are waveforms of a horizontal synchronous signal.

FIGS. 13A through 13D are waveforms of the horizontal synchronous signal. FIG. 13A shows the waveform of the third horizontal synchronous signal HS3 synchronized with the main clock signal CK. FIG. 13B shows the waveform of the third horizontal synchronous signal HS3 asynchronous with respect to the main clock signal CK. FIG. 13C shows the waveform of the signal output from the horizontal phase compensating portion 210. FIG. 13D shows the waveform of the DHS output from the horizontal start position determining portion 212.

A time difference between a third horizontal synchronous signal 222 and an active video signal 224 shown in FIGS. 13A and 13B changes, according to whether the current broadcasting method is NTSC or PAL, or whether the signal source is a video cassette recorder or a broadcasting station. Since the horizontal and vertical starting points of the screen displayed on the cathode ray tube vary due to the change (Hshift) of the time difference, the horizontal phase compensating portion 210 shown in FIG. 12 compensates the lag or lead of the phase of the third horizontal synchronous signal HS3 (the jitter of which is stabilized) output from the synchronous signal and clock signal generating portion 10. Namely, an adder 214 of the horizontal phase compensating portion 210 adds the horizontal change amount (Hshift) for compensating the phase of the third horizontal synchronous signal HS3 to the third horizontal synchronous signal HS3 and outputs the signal shown in FIG. 13C, which is the addition result, to the horizontal start position determining portion 212. Likewise, the vertical phase compensating portion 218 compensates the lag and lead of the phase of the third vertical synchronous signal VS3 (the jitter of which is stabilized). Namely, the adder 220 of the vertical phase compensating portion 218 adds the third vertical synchronous signal VS3 to the vertical change Vshift for compensating the phase of the third vertical synchronous signal VS3 and outputs the addition result to the coordinate value generating portion 14 and the output controlling portion 22 as the deflection vertical synchronous signal DVS.

The operation of the horizontal start position determining portion 212 is now described as follows.

A delay difference between a video processor (not shown) for displaying an RGB signal and a deflection processor (not shown) exists. That is, the processing time of the video processor is different from that of the deflection processor, by the delay difference. Therefore, the screen displayed by compensating the delay difference (Hpos) is always formed in the center of the screen. For this, the adder 216 of the horizontal start position determining portion 212 adds the signal shown in FIG. 13C output from the horizontal phase compensating portion 210 to the horizontal start position value Hpos and outputs the signal shown in FIG. 13D, which is the addition result, to the coordinate value generating portion 14 and the horizontal driving signal generating portion 18 as the deflection horizontal synchronous signal DHS. Namely, the signal shown in FIG. 13C moves by the horizontal start position value Hpos and outputs the moved signal shown in FIG. 13D as the deflection horizontal synchronous signal DHS.

Here, the vertical and horizontal change amounts Hshift and Vshift and the vertical starting position value Hpos correspond to the first predetermined values input from the controlling portion 24 through the input terminal IN2.

Figure 14:
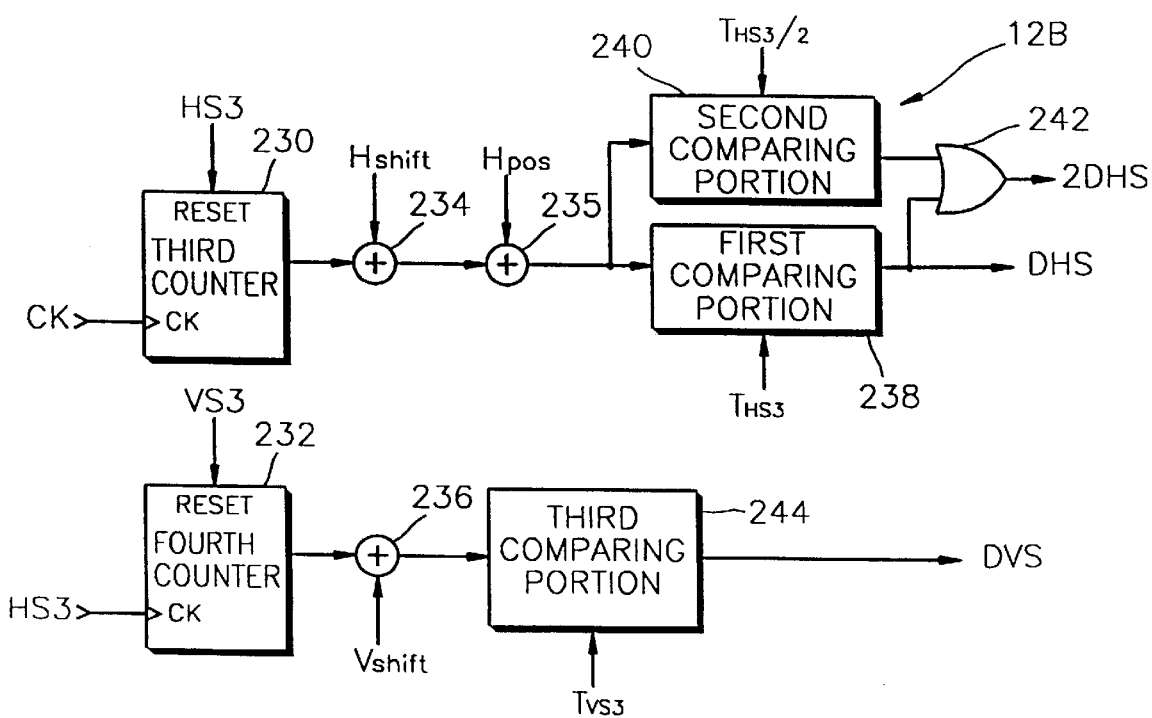
FIG. 14 is a circuit diagram of an alternative embodiment of a synchronous signal phase converting portion shown in FIG. 1.

FIG. 14 is a circuit diagram of another embodiment 12B of the synchronous signal phase converting portion 12 shown in FIG. 1. The synchronous signal phase converting portion is comprised of third and fourth counters 230 and 232, adders 234, 235, and 236, first, second, and third comparators 238, 240, and 244, and an OR gate 242.

The third counter 230 of the synchronous signal phase converting portion 12B shown in FIG. 14 performs counting in response to the main clock signal CK input to the clock terminal CK, is reset in response to the third horizontal synchronous signal HS3 input to the reset terminal RESET, and outputs the counted value to the adder 234. The fourth counter 232 performs counting in response to the third horizontal synchronous signal HS3 input to the clock terminal CK, is reset in response to the third vertical synchronous signal VS3 input to the reset terminal RESET, and outputs the counted value to the adder 236. At this time, the adder 234 adds the value counted by the third counter 230 to the horizontal change amount Hshift and outputs the addition result to the adder 235. The adder 235 adds the result added by the adder 234 to the horizontal start position value Hpos and outputs the addition result to the first and second comparators 238 and 240. The first comparator 238 compares the addition result with the period $T_{HS3}$ of the third horizontal synchronous signal HS3 and outputs the signal having the level corresponding to the comparison result to the OR gate 242, the horizontal drive signal generating portion 18, and the coordinate value generating portion 14 as the deflection horizontal synchronous signal DHS. Also, the second comparator 240 compares the result performed by the adder 235 with the half period $T_{HS3}/2$ of the third horizontal synchronous signal HS3 and outputs the signal having the level corresponding to the comparison result to the OR gate 242. The OR gate 242 performs an OR operation on the signal output from the second comparator 240 and the deflection horizontal synchronous signal DHS and outputs the OR operation result as the frequency multiplied deflection horizontal synchronous signal 2DHS, the frequency of which is double the frequency of the deflection horizontal synchronous signal DHS.

The adder 236 adds the value counted by the fourth counter 232 to the vertical change Vshift and outputs the addition result to the third comparator 244. The third comparator 244 compares the result obtained by the adder 236 with the period $T_{VS3}$ of the third vertical synchronous signal VS3 and outputs the signal having the level corresponding to the comparison result as the deflection vertical synchronous signal DVS. Here, the horizontal and vertical changes Hshift and Vshift, the horizontal start position value Hpos, the period $T_{HS3}$ and the half periods $T_{HS3}/2$ of the third horizontal synchronous signal HS3, and the period $T_{VS3}$ of the third vertical synchronous signal VS3 correspond to the first predetermined values input from the controlling portion 24 through the input terminal IN2.

The coordinate value generating portion 14 shown in FIG. 1 performs counting, synchronized with the deflection horizontal synchronous signal DHS or the frequency multiplied deflection horizontal synchronous signal 2DHS, and the deflection vertical synchronous signal DVS output from the synchronous signal phase converting portion 12, outputs the counted values Xval and Yval to the selection signal generating portion 16, operates the counted values Xval and Yval with the second predetermined values input from the controlling portion 24 through the input terminal IN3, and outputs the operation result to the interpolation value calculating portion 20 as the X and Y axis coordinate values (X and Y) of beam.

The structure and operation according to the embodiments of the present invention of the coordinate value generating portion 14 shown in FIG. 1 are described as follows.

Figure 15:
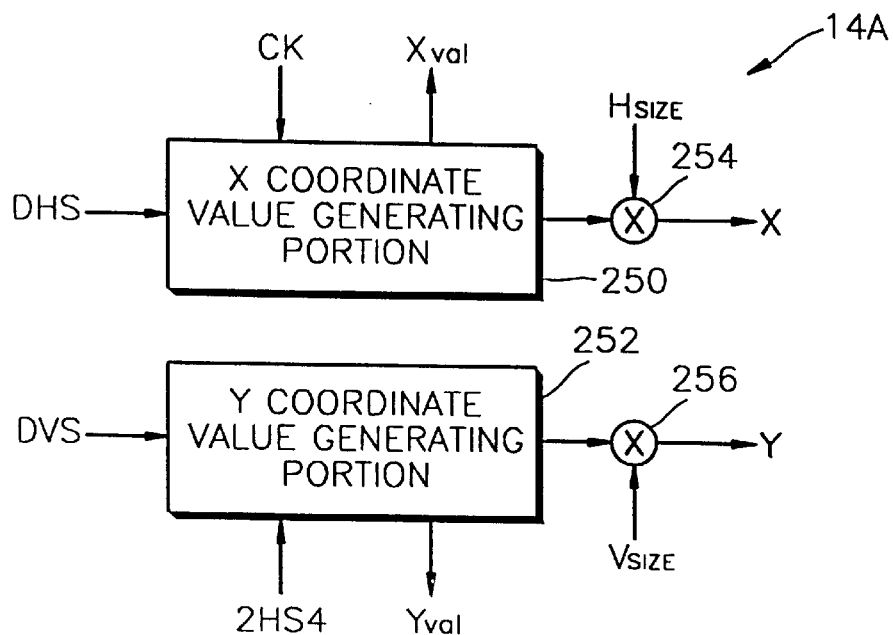
FIG. 15 is a circuit diagram of a preferred embodiment according to the present invention of a coordinate value generating portion shown in FIG. 1.

FIG. 15 is a circuit diagram of a preferred embodiment 14A according to the present invention of the coordinate value generating portion 14 shown in FIG. 1. The coordinate value generating portion 14A is comprised of X and Y value generating portions 250 and 252, and multipliers 254 and 256.

The X coordinate value generating portion 250 shown in FIG. 15 performs counting in response to the main clock signal CK, synchronized with the deflection horizontal synchronous signal DHS, normalizes the counted value Xval, and outputs the normalized value to a multiplexer 254. Likewise, the Y coordinate value generating portion 252 performs counting in response to the 2HS4 signal, synchronized with the deflection vertical synchronous signal DVS, normalizes the counted value Yval, and outputs the normalized value to the multiplier 256. At this time, the counted values Xval and Yval are output to the selection signal generating portion 16. The X coordinate value generating portion 250 can be realized as a pixel counter. The Y coordinate value generating portion 252 can be realized as a line counter. In order to change the horizontal and vertical sizes of the displayed screen, the multipliers 254 and 256 multiply the values normalized by the X and Y coordinate value generating portions 250 and 252 by the horizontal and vertical screen reducing and enlarging ratios (Hsize and Vsize), respectively, and output the multiplication result to the interpolation value calculating portion 20 as the X and Y axes coordinate values X and Y. Here, the horizontal and vertical screen reducing and enlarging ratios Hsize and Vsize correspond to the second predetermined values input from the controlling portion 24 through the input terminal IN3.

Figure 16:
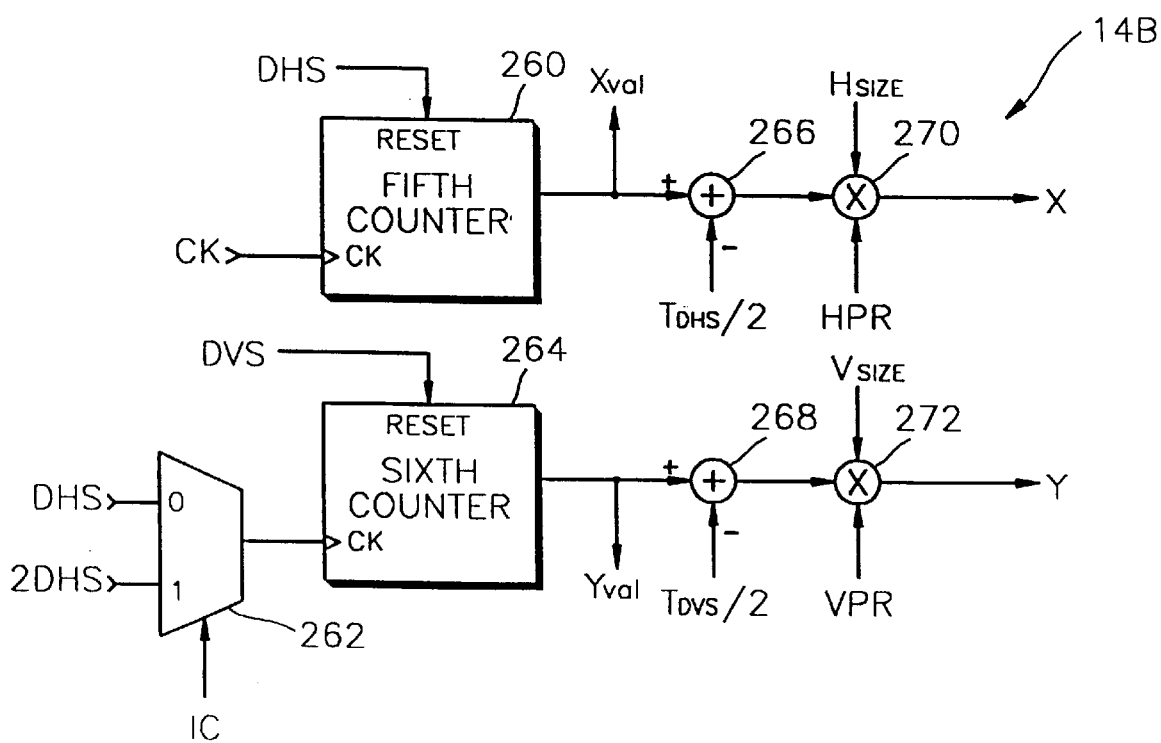
FIG. 16 is a circuit diagram of an alternative embodiment according to the present invention of the coordinate value generating portion shown in FIG. 1.

FIG. 16 is a circuit diagram of another embodiment 14B according to the present embodiment of the coordinate value generating portion 14 shown in FIG. 1. The coordinate value generating portion 14B is comprised of fifth and sixth counters 260 and 264, a multiplexer 262, subtracters 266 and 268, and multipliers 270 and 272.

The fifth counter 260 of the coordinate value generating portion 14B shown in FIG. 16 is reset in response to the deflection horizontal synchronous signal DHS input from the synchronous signal phase converting portion 12 to the reset terminal RESET, performs counting in response to the main clock signal CK input to the clock terminal CK, and outputs the count result Xval to the subtracter 266 and the selection signal generating portion 16. The multiplexer 262 selectively outputs either the deflection horizontal synchronous signal DHS output from the synchronous signal phase converting portion 12 or the frequency multiplied deflection horizontal synchronous signal 2DHS output from the OR gate 242 shown in FIG. 14 in response to the interlace control signal IC output from the controlling portion 24. Here, the interlace control signal IC is generated so that 2DHS can be selected when the apparatus shown in FIG. 1 is applied to a television.

The sixth counter 264 is reset in response to the deflection vertical synchronous signal DVS input to the reset terminal RESET, performs counting in response to the signal input to the clock terminal CK and selected by the multiplexer 262, and outputs the count result Yval to the selection signal generating portion 16 and the subtracter 268. The subtracter 266 further subtracts the half period $T_{DHS}/2$ of the deflection horizontal synchronous signal DHS from the value Xval counted by the fifth counter 260 and outputs the subtraction result to the multiplier 270. The subtracter 268 further subtracts the half period $T_{DVS}/2$ of the deflection vertical synchronous signal DVS from the value Yval counted by the sixth counter 264 and outputs the subtraction result to the multiplier 272. The multiplier 270 multiplies the result subtracted by the subtracter 266 and the horizontal screen reducing and enlarging ratio Hsize by the horizontal period rate HPR, and outputs the multiplication result to the interpolation value calculating portion 20 as the X axis coordinate value X. The multiplier 272 multiplies the result subtracted by the subtracter 268 and the vertical screen reducing and enlarging ratio Vsize by the vertical period rate VPR, and outputs the multiplication result to the interpolation value calculating portion 20 as the Y axis coordinate value Y. Here, the multipliers 270 and 272 multiply the horizontal period rate and the vertical period rate by the corresponding values in order to normalize the counted and subtracted values, for example, from −1.0 to 1.0.

The horizontal and vertical screen reducing and enlarging ratios Hsize and Vsize, the horizontal and vertical period rates HPR and VPR, and the half periods $T_{DHS}/2$ and $T_{DVS}/2$ of the deflection vertical and horizontal synchronous signals correspond to the second predetermined values input from the controlling portion 24 through the input terminal IN3.

The selection signal generating portion 16 shown in FIG. 1 performs a logic combination on the values Xval and Yval counted by the coordinate value generating portion 14 and outputs the logic combination result to the interpolation value calculating portion 20 as first through Eth selection signals $S_1$ through $S_E$.

A vertical sawtooth waveform can be used as vertical deflection current, amplified by a transistor external to the deflection processing apparatus shown in FIG. 1. However, a horizontal sawtooth waveform requires a large current since the frequency thereof is high, and is therefore difficult to amplify with the transistor. Therefore, the horizontal sawtooth current waveform is generated at the horizontal deflection circuit (not shown) external to the deflection processing apparatus. In this case, the horizontal drive signal HD controls the horizontal deflection circuit for generating the horizontal sawtooth current and is generated by the horizontal drive signal generating portion 18 shown in FIG. 1.

Namely, the horizontal drive signal generating portion 18 determines the rising and falling edges of the horizontal drive signal HD using a predetermined duty value input from the controlling portion 24 through the input terminal IN6, a fly back pulse (FBP), the phase difference of the horizontal drive signal, the deflection horizontal synchronous signal DHS, and the horizontal correct signal H_CORR. Here, the horizontal correcting signal H_CORR represents the correcting value calculated by the interpolation value calculating portion 20 with respect to V-bow and V-angle signal values, and is used for correcting the distortion of a side pin balance. The V-bow value corresponds to a phenomenon that the screen displayed in the cathode ray tube is curved in the appearance of a parabola in the left or right direction. The V-angle value corresponds to a phenomenon that the entire screen is vertically curved to have a parallelogram shape.

The fly back pulse (FBP) is a signal output from a fly back transformer during a retrace period. An ideal deflection is realized when the FBP coincides with the deflection horizontal synchronous signal (DHS). However, when a phase difference between the horizontal drive signal HD and the FBP is measured by counting the main clock signal CK from the point of time at which the horizontal drive signal (HD) is generated to the point of time at which the FBP is generated, the substantially counted value has errors of ±1 since the FBP is not always generated at the same point of time but has the swing of a time axis, i.e., ajitter. Therefore, the picture swings, since the correct deflection is not performed in a horizontal direction. Namely, jitter is generated. The detailed operation and structure of the horizontal drive signal generating portion 18 according to the present invention for generating the horizontal drive signal (HD) removed of the jitter are described as follows.

Figure 17:
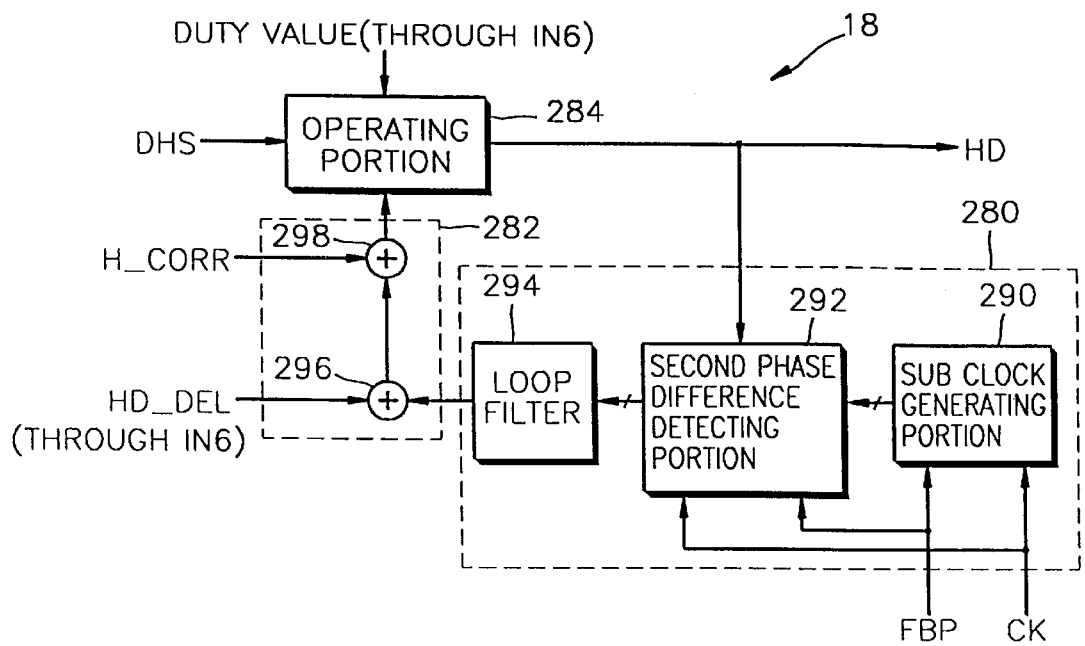
FIG. 17 is a block diagram according to the present invention of a horizontal drive signal generating portion shown in FIG. 1.

FIG. 17 is a block diagram according to the present invention of the horizontal drive signal generating portion 18 shown in FIG. 1. The horizontal drive signal generating portion 18 includes a phase difference stabilizing portion 280 comprised of a sub clock generating portion 290, a second phase difference detecting portion 292, and a loop filter 294, an adding portion 282 comprised of adders 296 and 298, and an operating portion 284.

The phase difference stabilizing portion 280 shown in FIG. 17 detects a phase difference between the horizontal drive signal HD and the fly back pulse FBP using the horizontal drive signal HD and the main clock signal CK, stabilizes the jitter of the detected phase difference using the main clock signal CK and the fly back pulse FBP, and outputs the phase difference the jitter of which is stabilized to the adding portion 282. For this, the sub clock generating portion 290 divides the period of the main clock signal CK into N sections (N is an integer not less than 2), detects the section in which the FBP is input among the sections divided into N, and outputs the value assigned to the detected section to the second phase difference detecting portion 292 as the decimal of the phase difference. The second phase difference detecting portion 292 detects the integer value of the phase difference using the main clock signal CK and the horizontal drive signal HD and outputs the decimal of the phase difference output from the sub block detecting portion 290 and the detected integer value of the phase difference to the loop filter 294 in response to the main clock signal CK and the fly back pulse FBP. The loop filter 294 receives the integer value and the decimal of the phase difference from the second phase difference detecting portion 292 and low-pass-filters them, stabilizes the jitter of the integer value using the low-pass-filtered decimal, and outputs the filtered integer value (the jitter of which is stabilized) to the adding portion 282 as the phase difference.

The adding portion 282 adds a predetermined correcting value HD_DEL for correcting the signal delay difference between a horizontal deflection circuit for generating sawtooth current and an east-west (EW) distortion correcting processor following the output terminal OUT4 shown in FIG. 1, and the phase difference output from the phase difference stabilizing portion 280, to a horizontal correct signal H_CORR output from the interpolation value calculating portion 20, and outputs the addition result to the operating portion 284. The EW distortion correcting processor corrects for EW pin cushion distortion. The adder 296 of the adding portion 282 adds the predetermined correcting value HD_DEL received from the controlling portion 24 through an input terminal IN6 to the phase difference output from the loop filter 294, and outputs the addition result to the adder 298. Adder 298 adds the later-described horizontal correct signal H_CORR output from the interpolation calculating portion 20 to the output of the adder 296 and outputs the addition result to the operating portion 284. The operating portion 284 counts the number of pixels in response to the deflection horizontal synchronous signal DHS, subtracts the output of the adder 298 from the number of the counted pixels, and determines the subtraction result as the rising edge of the horizontal drive signal HD. The operating portion 284 subtracts a predetermined duty value received from the controlling portion 24 through the input terminal IN6 from the rising edge of the horizontal drive signal HD, and determines the subtraction result as the falling edge of the horizontal drive signal HD. At this time, the operating portion 284 outputs the horizontal drive signal HD having the determined falling and rising edges.

The structure and operation of an embodiment according to the present invention of the phase difference stabilizing portion 280 shown in FIG. 17 will be described as follows.

Figure 18:
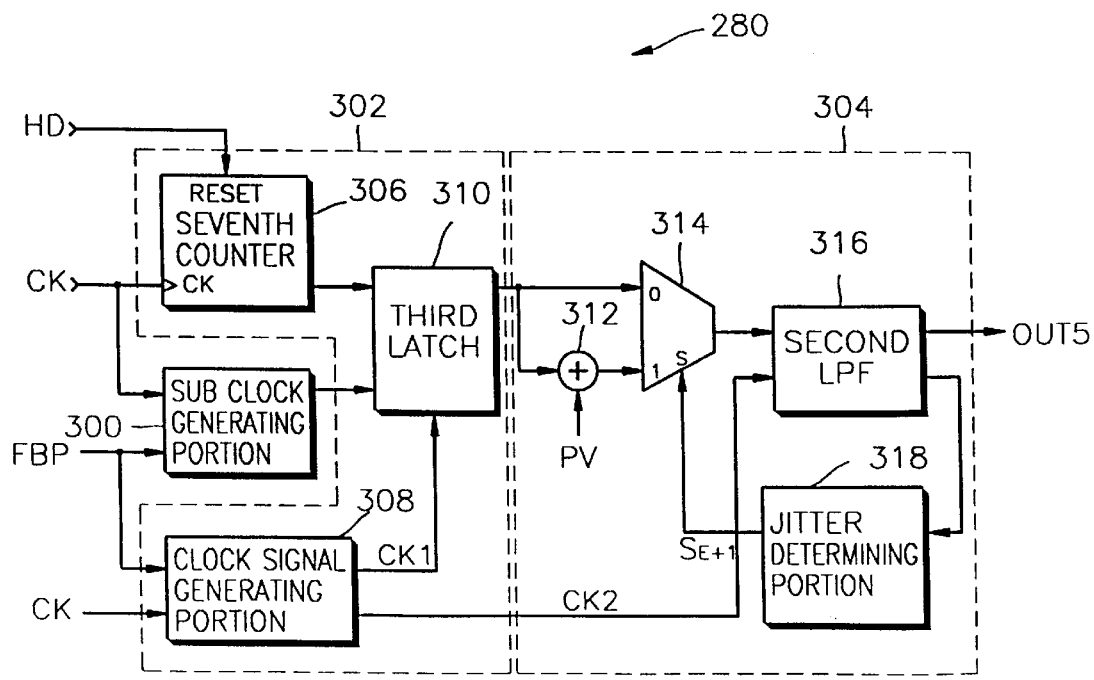
FIG. 18 is a block diagram of a preferred embodiment according to the present invention of a phase difference stabilizing portion shown in FIG. 17.

FIG. 18 is a block diagram of a preferred embodiment according to the present invention of the phase difference stabilizing portion 280 shown in FIG. 17. The phase difference stabilizing portion 280 includes a sub clock detecting portion 300, a second phase difference detector 302 comprised of a seventh counter 306, a clock signal generating portion 308, and a third latch 310 and a loop filter 304 comprised of an adder 312, a multiplexer 314, a second low pass filter LPF 316, and a jitter determining portion 318.

The sub clock generating portion 300, the second phase difference detecting portion 302, and the loop filter 304 shown in FIG. 18 respectively perform the same functions as those of the sub clock generating portion 290, the second phase difference detecting portion 292, and the loop filter 294 shown in FIG. 17. The sub clock detecting portion 300 shown in FIG. 18 detects the rising edge of the FBP by dividing one period of the main clock signal CK into N sections and outputs a predetermined value assigned to the detected edge to the third latch 310 as the decimal of the phase difference. This is described in detail as follows.

Figure 19:
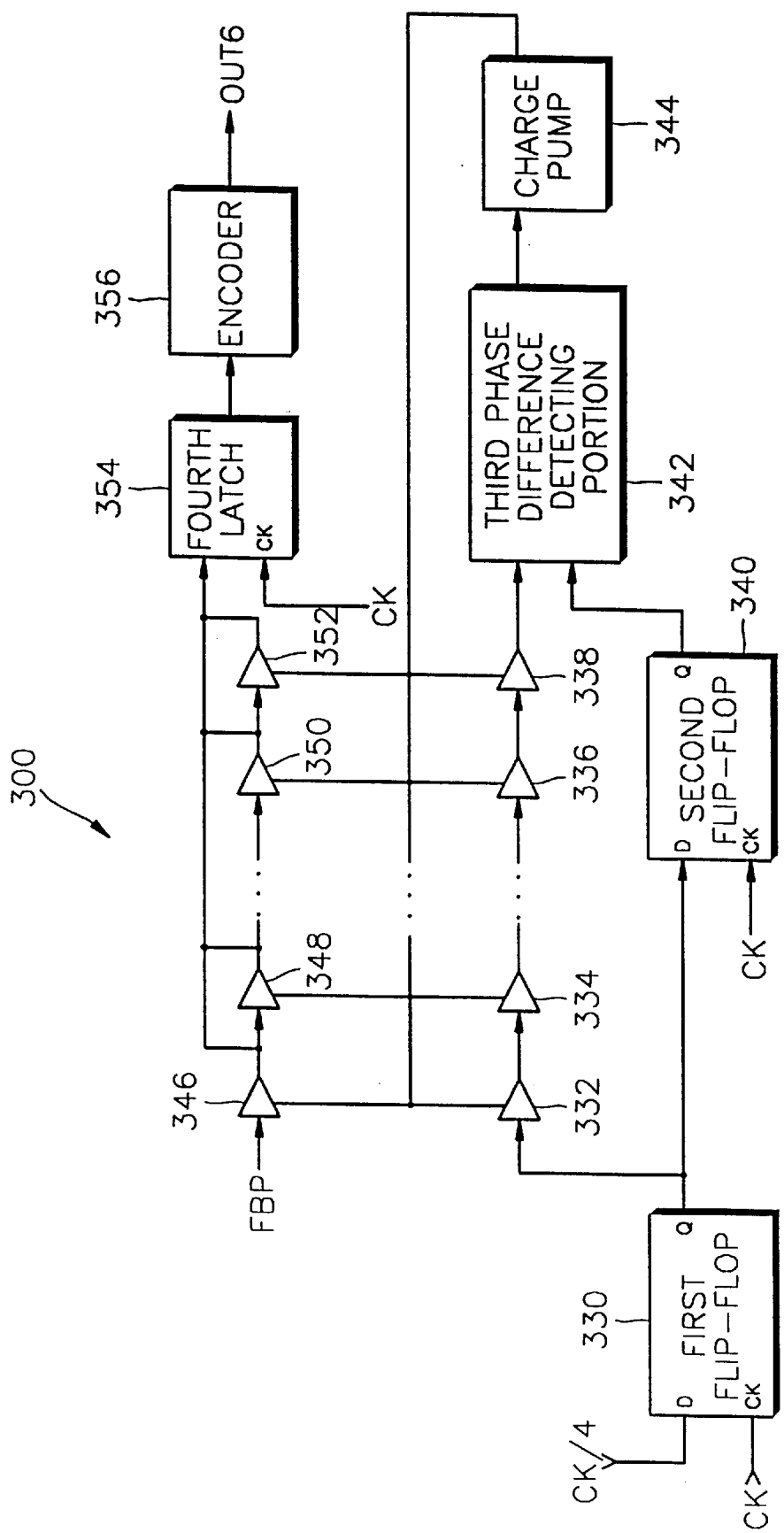
FIG. 19 is a block diagram of a sub clock detecting portion shown in FIG. 18.

FIG. 19 is a block diagram of the sub clock detecting portion 300 shown in FIG. 18. The sub clock detecting portion is comprised of first and second flip flops 330 and 340, first, second, . . . , N−1th, and Nth delays 332, 334, . . . , 336, and 338, N+1th, N+2th, . . . , 2N−1th, and 2Nth delays 346, 348, . . . , 350, and 352, a third phase difference detecting portion 342, a charge pump 344, a fourth latch 354, and an encoder 356.

The first flip flop 330 of the sub clock generating portion 300 shown in FIG. 19 receives the main clock signal CK/4, the frequency of which is multiplied by four, through a data input terminal D, receives the main clock signal CK through the clock terminal CK, and outputs positive output Q to the first delayer 332 and the data input terminal D of the second flip flop 340. The second flip flop 340 inputs the positive output Q of the first flip flop 330 through a data input terminal D, inputs the main clock signal CK through the clock terminal CK, and outputs the positive output Q to the third phase difference detecting portion 342.

The positive output of the first flip flop 330 is delayed by the first through Nth delays 332, 334, . . , 336, and 338 for a predetermined time and is output to the third phase difference detecting portion 342. The N+1th through 2Nth delays 346, 348, . . . , 250, and 252 receive the FBP, delay it for a predetermined time, and output the delayed FBP to a fourth latch 354. At this time, each delay time of the first through 2Nth delayers is controlled in response to the delay control signal output from the charge pump 344. Namely, the delay control signal controls the delay time of the each delayer so that the total delay time of the N delays corresponds with one period of the main clock signal CK.

The third phase difference detecting portion 342 detects the phase difference between the output of the Nth delayer 338 and the positive output Q of the second flip flop 340 and outputs the detected phase difference to the charge pump 344. The charge pump 344 charges or discharges predetermined charges corresponding to the phase difference detected from the third phase difference detecting portion 342, and outputs a signal having a level corresponding to the charged or discharged charges to the respective delayers as the delay control signal. The fourth latch 354, which can be realized as a D flip-flop, latches the signals output from the N+1th through 2Nth delayers 346, 348, . . . , 250, and 252 in response to the main clock signal CK. The encoder 356 encodes the latched value output from the fourth latch 354 and outputs the encoding result through an output terminal OUT6 to the third latch 310 shown in FIG. 18 as the decimal. The encoder 356 encodes the value, i.e., the number of '1', output from the fourth latch 354, and outputs the encoding result as the decimal. Namely, the encoding result corresponds to the value assigned to the section in which the FBP is detected.

In order to further describe the present invention, the sub clock detecting portion shown in FIG. 19 is now described in detail as follows, assuming N equals 8.

Figure 20:
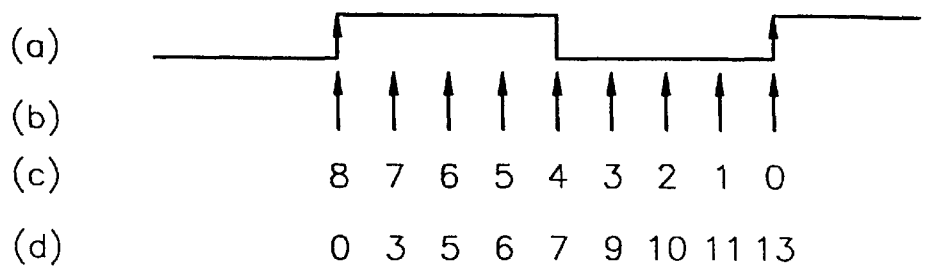
FIGS. 20A through 20D describe the operation of a sub clock detecting portion shown in FIG. 19.

FIGS. 20A through 20D describe the operations of the sub clock detecting portion shown in FIG. 19. FIG. 20A shows a waveform of the main clock signal CK. FIG. 20B shows as an arrow, a point at which the level of the FBP changes, i.e., the edge of the FBP. FIG. 20C shows the value output from the fourth latch 354 and showing the number of '1'. FIG. 20D shows the value encoded by the encoder 356.

When it is assumed that one period of the main clock signal CK shown in FIG. 20A is divided into eight as shown in FIG. 20B and the edge of the FBP is detected between the sixth arrow and the seventh arrow as shown in FIG. 20B among the eight sections, the fourth latch 354 outputs the value '2' shown in FIG. 20C, showing that two '1's exist, to the encoder 356. The encoder 356 encodes '2' and the encoded value '10' shown in FIG. 20D through the output terminal OUT6 to the third latch 310 as the decimal of the phase difference.

Figure 21:
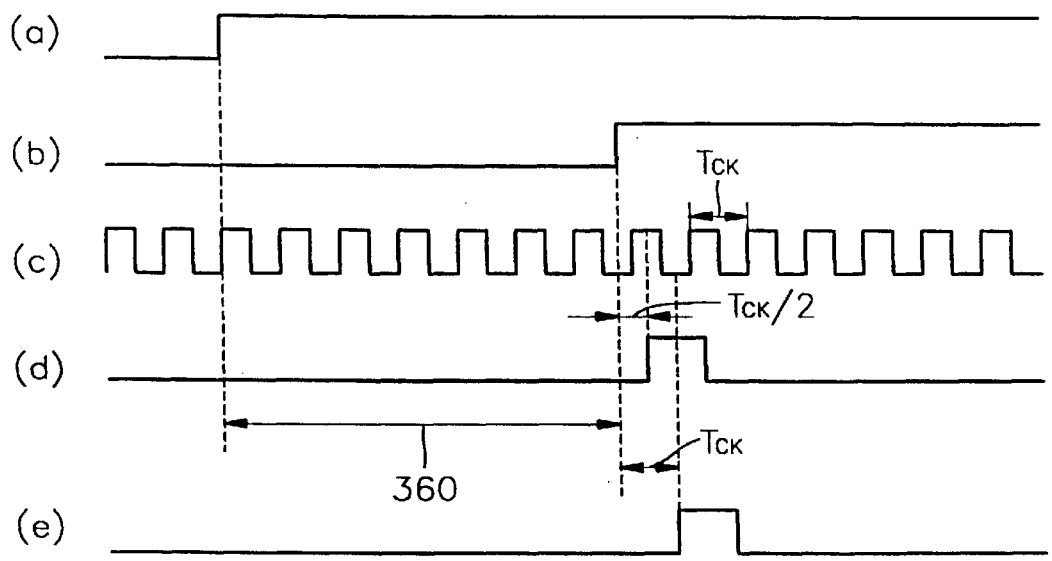
FIGS. 21A through 21E show waveforms for describing a second phase difference detecting portion shown in FIG. 18.

FIGS. 21A through 21D show waveforms for describing the second phase difference detecting portion 302 shown in FIG. 18. FIG. 21A shows the waveform of the horizontal drive signal HD. FIG. 21B shows the waveform of the FBP. FIG. 21C shows the waveform of the main clock signal CK having the period $T_{CK}$. FIG. 21D shows the waveform of the first clock signal CK1. FIG. 21E shows the waveform of the second clock signal CK2.

The seventh counter 306 of the second phase difference detecting portion 302 shown in FIG. 18 performs counting in response to the main clock signal CK input to the clock terminal CK, synchronized with the horizontal drive signal HD shown in FIG. 21A, and input to the reset terminal RESET, and outputs the counted value to the third latch 310 as the integer value of the phase difference 360 between the horizontal drive signal HD shown in FIG. 21A and the FBP shown in FIG. 21B. The clock signal generating portion 308 delays the FBP shown in FIG. 21B by first and second predetermined time amounts in response to the main clock signal CK, and outputs the differently-delayed fly back pulses as the first and second clock signals CK1 and CK2 shown in FIGS. 21D and 21E, respectively. Here, the first predetermined time corresponds to half $T_{CK}/2$ of the period $T_{CK}$ of the main clock signal CK. The second predetermined time corresponds to the period $T_{CK}$ of the main clock signal CK. The third latch 310 latches the decimal of the phase difference 360 output from the sub clock detecting portion 300 and the integer value of the phase difference 360 counted by the seventh counter 306 in response to the first clock signal CK1 shown in FIG. 21D, and outputs the latched value to the loop filter 304. At this time, the loop filter 304 stabilizes, i.e., reduces the jitter of the phase difference 360 and outputs the phase difference, the jitter of which is stabilized, through the output terminal OUT5.

For this, the adder 312 of the loop filter 304 shown in FIG. 18 adds the value output from the third latch 310 to a predetermined value, for example, 0.5 and outputs the addition result to the multiplexer 314. The multiplexer 314 selectively outputs either the value output from the third latch 310 or the addition result obtained by the adder 312 to the low pass filter 316, in response to the selection signal $S_{E+1}$ input from the jitter determining portion 318. The second low-pass-filter 316 low-pass-filters the output of the multiplexer 314 in response to the second clock signal CK2 shown in FIG. 21E, outputs the integer value of the low-pass-filtered phase difference 360 to the adding portion 282 shown in FIG. 17 through the output terminal OUT5, and outputs the decimal value of the low-pass-filtered phase difference 360 to the jitter determining portion 248. At this time, the second low-pass-filter 316 operates whenever the FBP shown in FIG. 21B is input and stabilizes the swing of the phase difference between the horizontal drive signal and the fly back pulse shown in FIGS. 21A and 21B, i.e., the jitter of the phase difference 360.

On the other hand, the jitter determining portion 318 determines the degree to which the decimal value of the phase difference 360 output from the second low-pass-filter 316 are approximates to '0', generates the selection signal $S_{E+1}$ so that the output of the adder 312 is selected when the decimal value does not approximate closely to '0' and that the output of the third latch 310 is selected when the decimal value approximates closely to '0', and outputs the selection signal to the multiplexer 314. Therefore, the jitter of the integer value output from the second low-pass-filter 316 can be removed. In this manner, the error of ±1 can be removed from the integer value.

As mentioned above, when it is assumed that the edge of the FBP shown in FIG. 21B is detected between the sixth edge point and the seventh edge point of the main clock signal CK shown in FIG. 21C, the third latch 310 latches the value '7' counted by the seventh counter 306 as the integer value of the phase difference in response to the first clock signal CK1 shown in FIG. 21D, and simultaneously latches the decimal '10' output from the sub clock detecting portion 300 as mentioned above. At this time, the real value of the integer value of the phase difference output from the third latch 310 is '6' obtained by subtracting '1' from '7'. The decimal '10' is output to the loop filter 304 without change. The phase difference output from the third latch 310 to the loop filter 304 becomes '000000110.1010' when it is expressed in 13 bits. The structure and operation of an embodiment of the present invention of the second low-pass-filter 316 shown in FIG. 18 is now described as follows.

Figure 22:
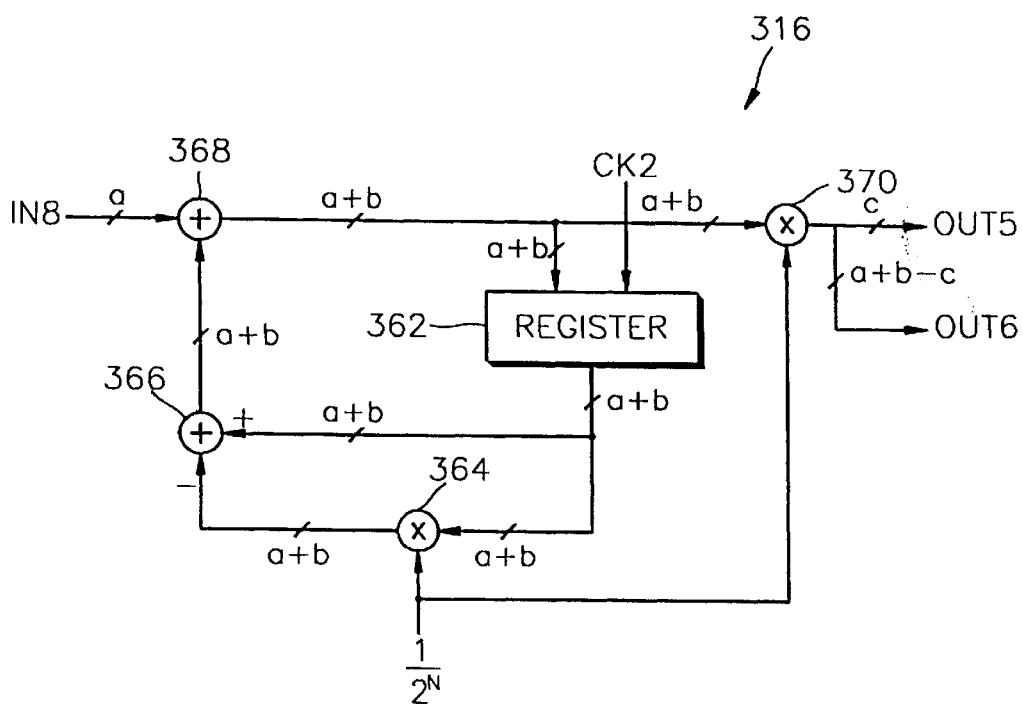
FIG. 22 is a circuit diagram of a preferred embodiment according to the present invention of a second low-pass-filter shown in FIG. 18.

FIG. 22 is a circuit diagram of a preferred embodiment of the present invention of the second low-pass-filter 316 shown in FIG. 18. The second low-pass-filter 316 is comprised of an adder 368, a subtracter 366, a register 362, and multipliers 364 and 370.

Figure 23:
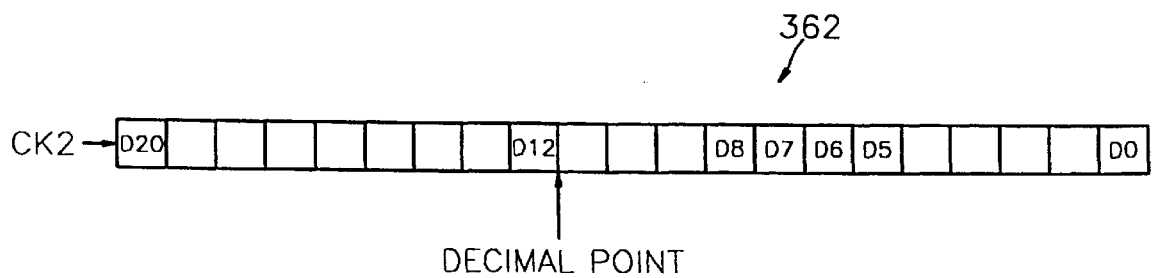
FIG. 23 shows an example of the structure of a register shown in FIG. 22.

FIG. 23 shows the exemplary structure of the register 362 shown in FIG. 22 for storing a+b bits, for example, 21 bits.

Here, it is assumed that c bits from the most significant bit (MSB), for example 9 bits, show the integer value and bits from the least significant bit (LSB), for example 4 bits, show the decimal value, in a phase difference 360 of a bits, for example 13 bits, output from the multiplexer 314 shown in FIG. 18.

The adder 368 shown in FIG. 22 adds the value input from the multiplexer 314 through the input terminal IN8 to the output of the subtracter 366, and outputs the addition result to the register 362 and the multiplier 370. Among the a+b bits, for example, 21 bits output from the adder 368, the register 362 shown in FIG. 23 stores the c bits, for example, 9 bits from the MSB in the flip flops D20 through D12 as the integer value of the phase difference and remaining bits, i.e., a+b−c bits in the flip flops D11 through D0 as the decimal, in response to the second clock signal CK2 shown in FIG. 21E. The multiplier 364 multiplies the output of the register 362 by $$\frac{1}{2^N},$$

and outputs the multiplication result to the subtracter 366. The subtracter 366 subtracts the output of the multiplier 364 from the output of the register 362 and outputs the subtraction result to the adder 368. The multiplier 370 multiplies the output of the adder 368 by $$\frac{1}{2^N},$$

outputs the integer value of the 9 bits in the multiplication result to the adder 282 through the output terminal OUT5 and outputs the decimal of the a+b−c bits, for example the 12 bits in the multiplication result, to the jitter determining portion 318 through the output terminal OUT6. The number of the bits a+b−c of the decimal value is variable, depending on the application.

It is assumed that the jitter determining portion 318 shown in FIG. 18 receives the bits stored in the flip flops D11 through D4 of the register 362 shown in FIG. 22. When the bits of '0' or '1' are not less than 6 times continuously input from the second low-pass-filter 316, it is determined that the decimal of the phase difference is closely approximated to '0', thus outputting the selection signal $S_{E+1}$ having a certain logic level, for example, a low logic level. When the bits of the same level are not less than 6 times continuously input again, the logic level of the selection signal $S_{E+1}$ is toggled and output.

As a result, the horizontal drive signal generating portion 18 shown in FIG. 1 precisely measures the phase difference between the HD and FBP signals to the 1/Nth degree and corrects the phase difference, thus removing the jitter of the phase difference.

The apparatus shown in FIG. 18 can be used for measuring a phase difference between a reference signal synchronized with a system clock signal and a comparison signal, asynchronous with respect to the system clock signal. For this, if the reference signal is input to the terminal to which the horizontal drive signal HD is input, the comparison signal is input to the terminal to which the fly back pulse FBP is input, and the system clock signal is input to the terminal to which the main clock signal CK is input, the phase difference between the reference signal and the comparison signal can be precisely determined.

The interpolation value calculating portion 20 shown in FIG. 1 calculates distortion correcting functions [F(X) and F(Y)] represented below in Equation 2 by a time division method in response to the selection signals $S_1$ through $S_E$ generated from the selection signal generating portion 16, calculates the interpolation values of the X and Y axis coordinates using the calculated distortion correction functions, and outputs the calculated interpolation values as the horizontal correct signal H_CORR, the dynamic focus signal DF, the vertical sawtooth drive signal VD1, or the east-west distortion compensation signal EW' signal values. Namely, the interpolation value calculating portion 20 obtains the H_CORR, the DF, the VD1, and the EW' signal values by the time division method:

$$F(X) = s_0 f_0(X) + s_1 f_1(X) + \ldots + s_n f_n(X)$$
$$F(Y) = s_0 f_0(Y) + s_1 f_1(Y) + \ldots + s_n f_n(Y) \quad (2)$$

wherein, $s_0$ through $s_n$ represent seed values and $f_0(X)$ through $f_n(X)$ and $f_0(Y)$ through $f_n(Y)$ are lagrange functions which are nth order polynomials with respect to the X and Y axis coordinates (X and Y), respectively.

The above-mentioned lagrange functions are now described as follows. For purpose of illustration, the lagrange function is described with respect to F(X). However, when X is replaced by Y, the same principles can be applied to F(Y).

The interpolation means, when there are various points (each point having an externally-provided seed value) on the X and Y axis of the displayed screen, obtains the most natural curve linking the points. The most natural curve which links m points is the polynomial having m coefficients. That is referred to as the polynomial interpolation method.

The distortion correcting function [F(X)] for correcting the distortion generated in the cathode ray tube is represented by a biquadratic equation:

$$F(X)=a*X^4+b*X^3+c*X^2+d*X+e \quad (3)$$

wherein, X represents the X axis coordinate value output from the coordinate value generating portion 14, and a, b, c, d, and e represent coefficients.

The desired waveform of a distortion correcting function can be formed by adjusting the respective coefficients a, b, c, d, and/or e of Equation 3. The distortion correcting function of Equation 3 can be represented by a lagrange function as Equation 4:

$$F(X)=S_0*f_0(X)+S_1*f_1(X)+S_2*f_2(X)+S_3*f_3(X)+S_4*f_4(X) \quad (4)$$

wherein, the lagrange functions $f_0(X)$ through $f_4(X)$ are represented by Equation 5.

$$f_0(X) = \frac{(X-x1)(X-x2)(X-x3)(X-x4)}{(x0-x1)(x0-x2)(x0-x3)(x0-x4)} \quad (5)$$

$$f_1(X) = \frac{(X-x0)(X-x2)(X-x3)(X-x4)}{(x1-x0)(x1-x2)(x1-x3)(x1-x4)}$$

$$f_2(X) = \frac{(X-x0)(X-x1)(X-x3)(X-x4)}{(x2-x0)(x2-x1)(x2-x3)(x2-x4)}$$

$$f_3(X) = \frac{(X-x0)(X-x1)(X-x2)(X-x4)}{(x3-x0)(x3-x1)(x3-x2)(x3-x4)}$$

$$f_4(X) = \frac{(X-x0)(X-x1)(X-x2)(X-x3)}{(x4-x0)(x4-x1)(x4-x2)(x4-x3)}$$

wherein, x0 through x4 represent X axis coordinates in which the seed values $s_0$ through $s_4$ exist and X represents the X axis coordinate value of a scanned pixel.

Figure 24:
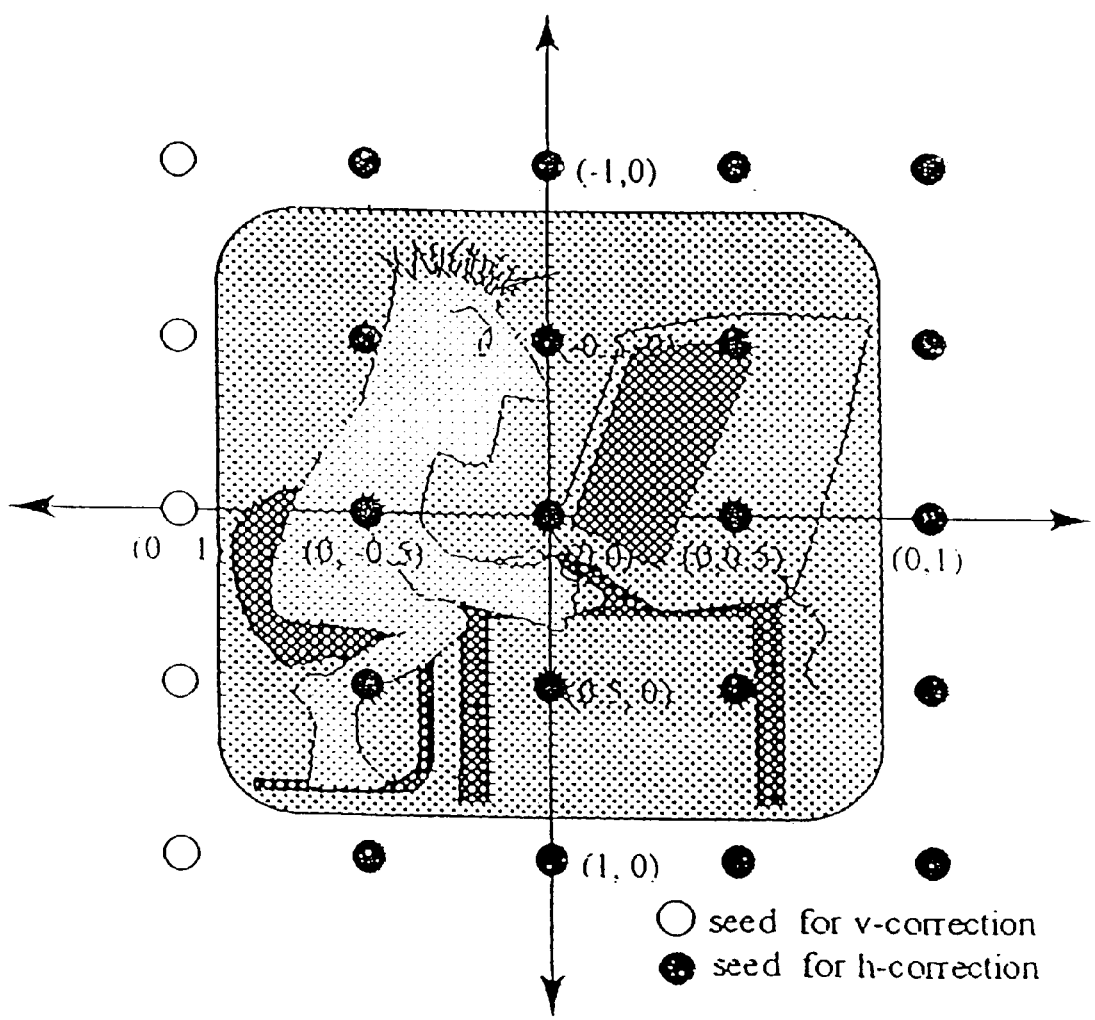
FIG. 24 shows the coordinate values of a seed in vertical and horizontal directions, in a screen displayed in a cathode ray tube.

FIG. 24 shows the coordinate values of the seed with respect to the vertical and horizontal directions, for a screen displayed in the cathode ray tube.

When the seed values shown in FIG. 24 are substituted for Equation 5 and a predetermined value, for example, ⅔ is multiplied by the respective lagrange functions [$f_0(X)$ through $f_4(X)$], the lagrange functions [$f_0(X)$ through $f_4(X)$] are represented by:

$$f_0(X) = (X+0.5)*X*(X-0.5)*(X-1.0) \quad (6)$$
$$= (X^2-0.25)*(X^2-X),$$

$$f_1(X) = (X+1.0)*X*(X-0.5)*(X-1.0)*(-4)$$
$$= (X^2-1.0)*(X^2-0.5*X)*(-4),$$

$$f_2(X) = (X-1.0)*(X-0.5)*(X+0.5)*(X+1.0)*6$$
$$= (X^2-1.0)*(X^2-0.2)*6,$$

$$f_3(X) = (X+1.0)*(X+0.5)*X*(X-1.0)*(-4)$$
$$= (X^2-1.0)*(X^2+0.5*X)*(-4),$$

$$f_4(X) = (X+1.0)*(X+0.5)*X*(X-0.5)$$
$$= (X^2-0.25)*(X^2+X)$$

Therefore, the distortion correcting function [F(X)] becomes:

$$F(X)=\{s_0f_0(X)+s_1f_1(X)+s_2f_2(X)+s_3f_3(X)+s_4f_4(X)\}*⅔ \quad (7)$$

The structure and operation of a preferred embodiment according to the present invention of the interpolation value calculating portion 20 shown in FIG. 1 using the above-mentioned lagrange biquadratic (for example n=4) interpolation method, the time division method, and a multiplier, in order to obtain the most natural curve which links K points (for example five points), and a method for operating the interpolation value calculating portion is now described as follows under the assumption that five external seed values are provided.

Figure 25:
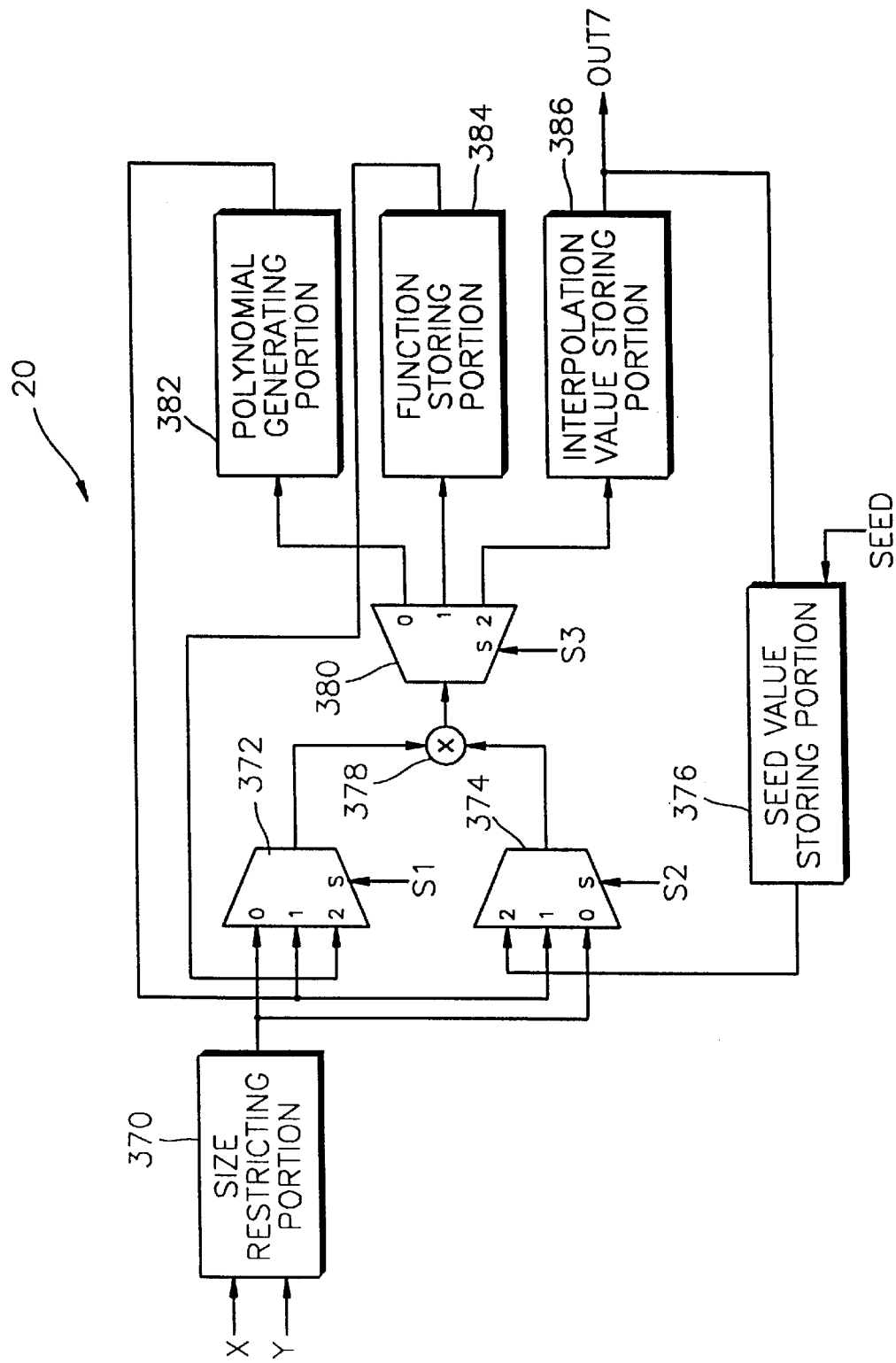
FIG. 25 is a block diagram of a preferred embodiment according to the present invention of an interpolation value calculating portion shown in FIG. 1.

FIG. 25 is a block diagram of a preferred embodiment according to the present invention of the interpolation value calculating portion 20 shown in FIG. 1. The interpolation value calculating portion is comprised of a size restricting portion 370, multiplexers 372 and 374, a demultiplexer 380, a multiplier 378, a seed value storing portion 376, a polynomial generating portion 382, a function storing portion 384, and an interpolation value storing portion 386.

Figure 26:
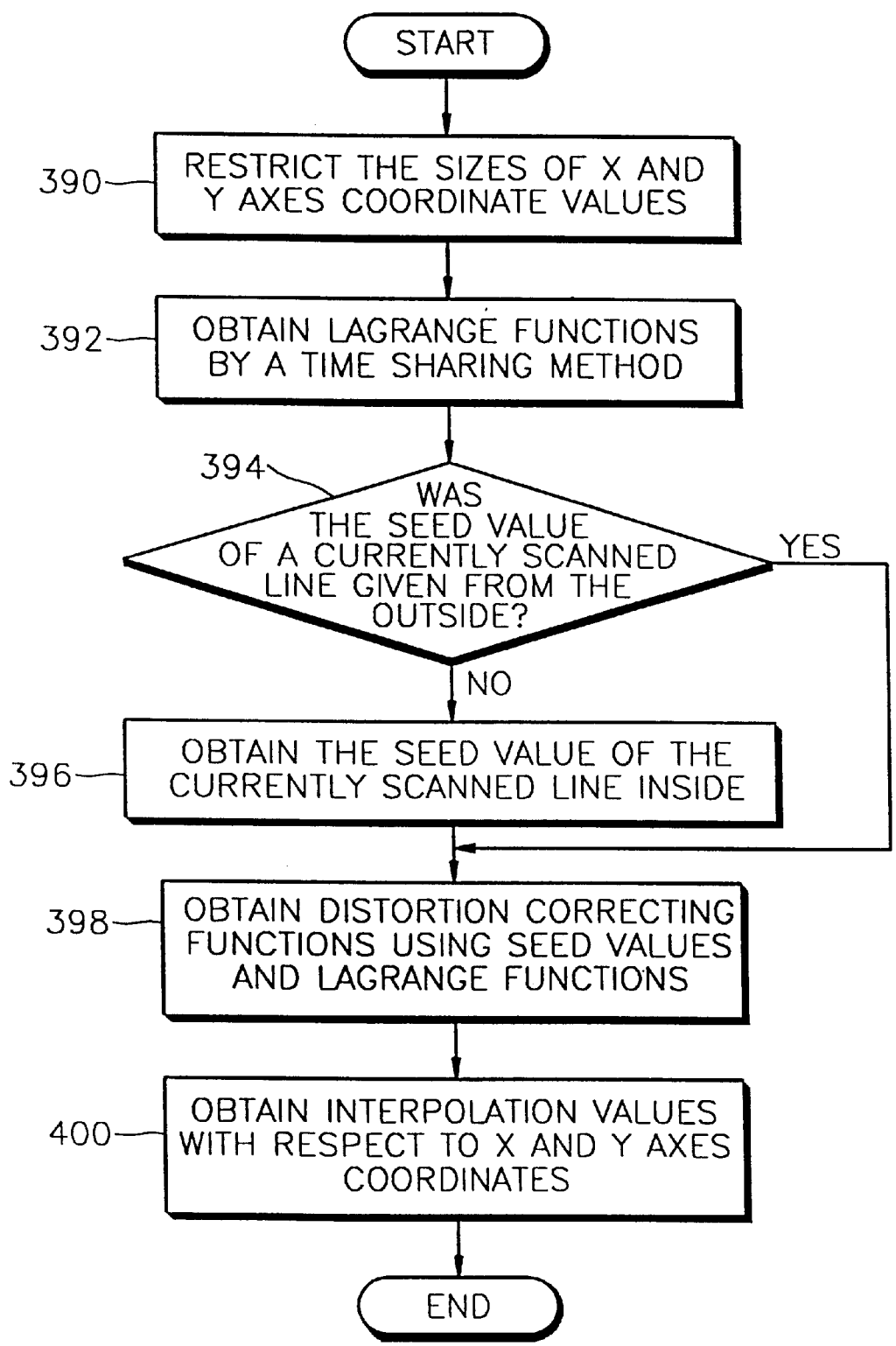
FIG. 26 is a flowchart for describing the interpolation value calculating method according to the present invention performed in the device shown in FIG. 25.

FIG. 26 is a flowchart for describing a method of calculating the interpolation value according to the present invention, performed by the apparatus shown in FIG. 25. The method includes the steps of obtaining the lagrange functions by the time division method (steps 390 and 392) and obtaining the interpolation value using the seed values (steps 394 through 400).

The size restricting portion 370 shown in FIG. 25 restricts the sizes of the X axis coordinate value (X) and the Y axis coordinate value (Y), input from the coordinate value generating portion 14, to be, for example, between +1.0 and −1.0 and outputs X and Y having the restricted sizes to the multiplexers 372 and 374, respectively (step 390).

Before describing the step 392, the operation of the respective portions shown in FIG. 25 are described as follows. The polynomial generating portion 382 stores the polynomials of the lagrange functions [$f_0(X)$ through $f_4(X)$ and $f_0(Y)$ through $f_4(Y)$], performs an accumulation or a subtraction with respect to signals output from the demultiplexer 380, and outputs the addition or subtraction result to the multiplexers 372 and 374. For this, the polynomial generating portion 382 can include an accumulator, subtracters and memory. The function storing portion 384 stores the lagrange functions or the distortion correcting functions output from the demultiplexer 380, outputs the stored lagrange functions or the distortion correcting functions to the multiplexer 372, and can include the adder (not shown) and the memory (not shown). The seed value storing portion 376 stores the predetermined number of seed values input from the controlling portion 24 as external seed values and receives the interpolation value of the vertical direction output from the interpolation value storing portion 386 as an internal seed value, when the seed value with respect to a currently scanned line is not input from the controlling portion 24, and stores the received interpolation value. Here, the seed value storing portion 376 can be realized by a single port static RAM (SPSRAM) and can store the externally-provided seed values with respect to the DF, the VD1, the EW1, and the H_CORR in the separate memory (not shown). The interpolation value storing portion 386 stores the interpolation values of the vertical and horizontal directions output from the demultiplexer 380, outputs the stored interpolation value of the vertical direction to the seed value storing portion 376 as the internal seed value, and outputs the interpolation value of the horizontal direction through the output terminal OUT7 as the horizontal correct signal H_CORR, the dynamic focus signal DF, the vertical sawtooth drive signal VD1, or the east-west distortion compensation signal EW1. At this time, since the interpolation value calculating portion 20 shown in FIG. 25 obtains the DF, the VD1, the EW1, and the H_CORR by the time division method, the interpolation value storing portion 386 stores the DF, the VD1, the EW1, and the H_CORR in separate memories, outputs the stored H_CORR to the horizontal drive signal generating portion 18, outputs the DF to the first DAC 26, and outputs the VD1 and EW1 to the output adjusting portion 22.

The multiplexer 372 selectively outputs one among the values output from the polynomial generating portion 382, the value output from the function storing portion 384, and the X or Y values output from the size restricting portion 370 to the multiplier 378 in response to the selection signal S1. The multiplexer 374 selectively outputs one among the X or Y values output from the size restricting portion 370, the external or internal seed values output from the seed value storing portion 376, and the values output from the polynomial generating portion 382 to the multiplier 378 in response to the selection signal S2. The multiplier 378 multiplies the outputs of the multiplexers 372 and 374 with each other and outputs the multiplication result to the demultiplexer 380. The multiplier 378 performs the multiplication operations of Equation 6. The demultiplexer 380 selectively outputs the output of the multiplier 378 to one among the polynomial generating portion 382, the function storing portion 384, and the interpolation value storing portion 386 in response to the selection signal S3. Here, the selection signals S1, S2, and S3 are output from the selection signal generating portion 28.

Following step 390 of FIG. 26, the lagrange functions represented by Equation 6 are obtained by the division method using the external or internal seed values, the X or Y values, and the apparatus 20 shown in FIG. 25 (the step 392). For example, the operation for obtaining the lagrange function $[f_0(X)]$ will be described as follows. The multiplexers 372 and 374 selectively output the X value, output from the size restricting portion 370, to the multiplier 378 in response to the selection signals S1 and S2. The demultiplexer 380 outputs to the polynomial generating portion 382 the value $x^2$ output from the multiplier 378 in response to the selection signal S3. The polynomial generating portion 382 subtracts 0.25 from $X^2$ using an included subtracter (not shown) and stores the subtraction result. Then, the multiplexers 372 and 374 selectively output the X value output from the size restricting portion 370 to the multiplier 378 in response to the selection signals S1 and S2. The polynomial generating portion 382 stores $X^2$ input through the demultiplexer 380, subtracts X input through the multiplexers 372 and 374, the multiplier 378, and the demultiplexer 380, from $X^2$, outputs the subtraction result $X^2-X$ to either the multiplexer 372 or the multiplexer 374, and outputs the previously stored value $X^2-0.25$ to another multiplexer. Then, $X^2-0.25$ is multiplied by $X^2-X$ in the multiplier 378 and the multiplication result is stored in the function storing portion 384 via the demultiplexer 380 as the lagrange function $[f_0(X)]$. The remaining functions $[f_0(X)$ through $f_4(X)$ and $f_0(Y)$ through $f_4(Y)]$ of Equation 6 can be calculated in a similar manner.

Following step 392 of FIG. 26, before calculating Equation 7, the seed value storing portion 376 determines whether the corresponding seed values (SEED) $s_0$ through $s_4$ with respect to the X axis coordinate values of the currently scanned line are externally provided, namely, from the controlling portion 24 (step 394). When the seed values with respect to the currently scanned line are not given from the controlling portion 24, the interpolation value calculating portion 20 shown in FIG. 25 determines as the internal seed values the interpolation values with respect to the Y axis coordinate values, namely, of the vertical direction, obtained in the section from the point of time at which the level of the deflection horizontal synchronous signal DHS changes to the point of time before an active video signal is input (step 396).

Following step 396, or when the seed values are given from the controlling portion 24, the distortion correcting function of Equation 7 is obtained using the internal or external seed values in the section to which the active video signal is input (step 398). For this, the multiplexer 372 selects the lagrange function output from the function storing portion 384 and the multiplexer 374 selects the internal or external seed value output from the seed value storing portion 376. The multiplier 378 multiplies $s_0$ by $f_1(X)$, $s_1$ by $f_1(X)$, $s_2$ by $f_2(X)$, $s_3$ by $f_3(X)$, and $s_4$ by $f_4(X)$ according to the time division method and outputs the multiplication results to the demultiplexer 380. At this time, the function storing portion 384 accumulates the multiplication results input from the multiplier 378 through the demultiplexer 380 and stores the accumulation result. The multiplexer 372 selects the accumulation result $[s_0f_0(X)+s_1f_1(X)+s_2f_2(X)+s_3f_3(X)+s_4f_4(X)]$ output from the function storing portion 384 and outputs the selected value to the multiplier 378. The multiplexer 374 selects a predetermined value, for example, ⅔, output from the seed value storing portion 376 and outputs the selected value to the multiplier 378. The multiplier 378 multiplies the accumulation result $[s_0f_0(X)+s_1f_1(X)+s_2f_2(X)+s_3f_3(X)+s_4f_4(X)]$ by ⅔ and outputs the multiplication result to the function storing portion 384 through the demultiplexer 380. The function storing portion 384 stores the multiplication result input from the multiplier 378 through the multiplexer 380 as the distortion correcting function represented in Equation 7. The distortion correcting function corresponding to each of the H_CORR, the DF, the VD1, and the EW1 obtained by the above-described time division method is stored in the separate memory (not shown) of the function storing portion 384.

Following step 398, the interpolation values of the vertical and horizontal directions are obtained by substituting the X and Y axis coordinate values (X and Y) for the variables of the corresponding distortion correcting functions [F(X) and F(Y)] stored in the function storing portion 384 (step 400). Namely, the value output from the size restricting portion 370 is substituted for the variable (X or Y) of the distortion correcting function stored in the function storing portion 384. As a result, the interpolation values with respect to the respective coordinate values are calculated and are stored in the interpolation value storing portion 386. The horizontal direction component among the stored interpolation values is output through the output terminal OUT7 as the VD1, the EW1, the DF, or the H_CORR.

The above-described interpolation value calculating portion 20 according to the present invention is capable of correcting all the distortions of the cathode ray tube, for example, a distortion due to a deflection coil such as a parallelogram distortion, a tilt distortion, a side pin balance distortion, a distortion due to the flattening of a screen such as a pin cushion distortion, horizontal and vertical linearity distortions, and a trapezoid distortion.

When a high beam level is emitted, electrons are accumulated on the screen, thus lowering the electric high tension (EHT) voltage and the kinetic energy of beam. Accordingly, since the deflecting force is relatively strengthened, the size of an image is enlarged. To solve the problem, the output adjusting portion 22 shown in FIG. 1 adjusts the gains of the vertical sawtooth drive signal VD1 and the EW1 using the distributed EHT obtained by distributing the EHT of the cathode ray tube, a corresponding predetermined value among the second predetermined values, and the third predetermined values and outputs the vertical sawtooth drive signal VD2 and the EW2, the gains of which are adjusted, to the second and third DACs 28 and 30, respectively.

The structure and operation of the embodiments according to the present invention of the output adjusting portion 22 will be described as follows.

Figure 27:
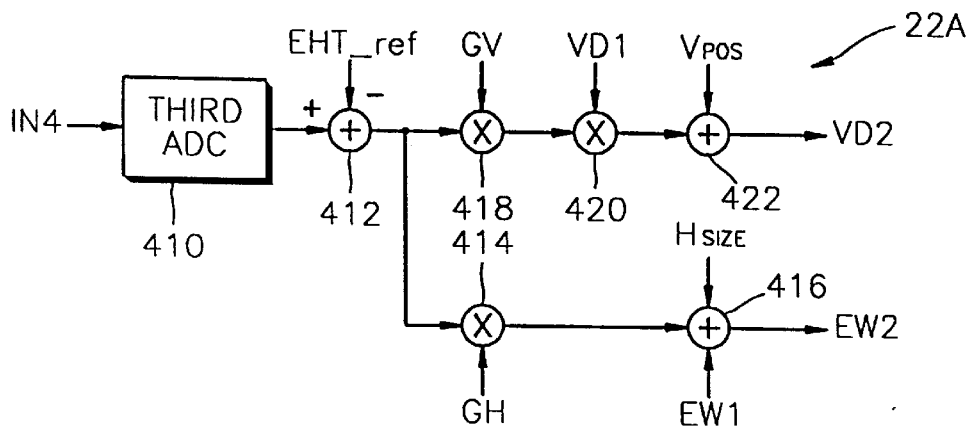
FIG. 27 is a circuit diagram of a preferred embodiment according to the present invention of an output adjusting portion shown in FIG. 1.

FIG. 27 is a circuit diagram of a preferred embodiment 22A according to the present invention of the output adjusting portion 22 shown in FIG. 1. The output adjusting portion 22 is comprised of a third analog/digital compensating portion ADC 410, a subtracter 412, multipliers 414, 418, and 420, and adders 416 and 422.

The EHT measured in the screen is distributed by a series resistance (not shown) and the distributed EHT is input to the third ADC 410 through the input terminal IN4 shown in FIGS. 1 and 27. The third ADC 410 converts the distributed analog EHT into a digital voltage, and outputs the converted digital voltage to the subtracter 412. The subtracter 412 subtracts from the digital voltage converted by the third ADC 410, the digital reference EHT (EHT_ref) received from the controlling portion 24 through the input terminal IN5, and outputs the subtraction result to the multipliers 414 and 418. The digital reference EHT (EHT_ref) corresponds to the center value of an ideal digital voltage EHT. The multiplier 418 multiplies the subtraction result obtained by the subtracter 412 by the vertical gain GV and outputs the multiplication result to the multiplier 420. The multiplier 420 multiplies the vertical sawtooth drive signal VD1 output from the interpolation value calculating portion 20 by the output of the multiplier 418 and outputs the multiplication result to the adder 422. At this time, in order to change the vertical starting position of the displayed screen, the adder 422 adds the value output from the multiplier 420 to the vertical starting position value $V_{POS}$ and outputs the addition result to the second DAC 28 as the vertical sawtooth drive signal VD2 the gain of which is adjusted. Here, the vertical starting position value $V_{POS}$ is used for moving the displayed screen up and down.

The multiplier 414 multiplies the subtraction result obtained by the subtracter 412 by the horizontal gain GH, and outputs the multiplication result to the adder 416. The adder 416 adds the screen reducing and enlarging ratios of the horizontal direction, the multiplication result obtained by the multiplier 414, and the east-west distortion compensation signal EW1 output from the interpolation value calculating portion 20 to one another, and outputs the addition result to the third DAC 30 (see FIG. 1) as the east-west distortion compensation signal EW2 the gain of which is adjusted.

The above-mentioned screen reducing and enlarging ratios (Hsize) of the horizontal direction is the corresponding predetermined value among the second predetermined values output from the controlling portion 24 through the input terminal IN3. The horizontal and vertical gains GH and GV, the reference EHT (EHT_ref), and the vertical starting position value $V_{POS}$ correspond to the third predetermined values input from the controlling portion 24 through the input terminal IN5.

Figure 28:
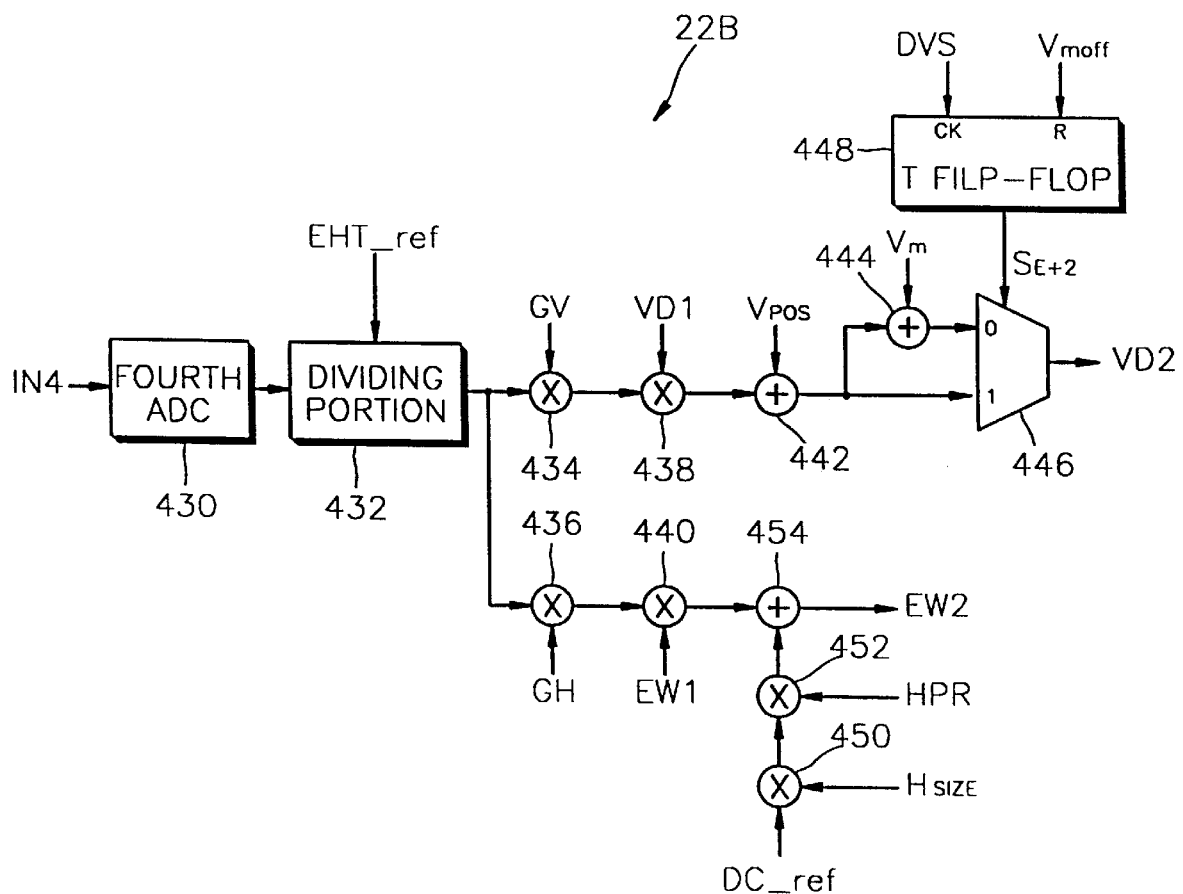
FIG. 28 is a circuit diagram of another embodiment according to the present invention of the output adjusting portion shown in FIG. 1.

FIG. 28 is a circuit diagram of another embodiment 22B according to the present invention of the output adjusting portion 22 shown in FIG. 1. The output adjusting portion is comprised of a fourth ADC 430, a dividing portion 432, multipliers 434, 436, 438, 440, 450, and 452, adders 442, 444, and 454, a multiplexer 446, and a T flip-flop 448.

The fourth ADC 430 shown in FIG. 28 converts the voltage obtained by distributing the EHT of the cathode ray tube input through the input terminal IN4 into the digital voltage and outputs the converted voltage to the dividing portion 432. The dividing portion 432 divides the digital voltage output from the fourth ADC 430 by the reference EHT (EHT_ref) and outputs the division result to the multipliers 434 and 436. The multiplier 434 multiplies the division result obtained by the dividing portion 432 by the vertical gain GV and outputs the multiplication result to the multiplier 438. The multiplier 438 multiplies the multiplication result obtained by the multiplier 434 by the vertical sawtooth drive signal VD1 output from the interpolation value calculating portion 20, and outputs the multiplication result to the adder 442. The adder 442 adds the multiplication result obtained by the multiplier 438 to the vertical starting position value $V_{POS}$ and outputs the addition result to the adder 444 and the multiplexer 446. Here, the adder 442 performs the same function as the adder 422 shown in FIG. 27.

At this time, the adder 444 adds the addition result obtained by the adder 442 to the vertical Moire value (Vm), and outputs the addition result to the multiplexer 446. The multiplexer 446 selects either the addition result obtained by the adder 444 or the addition result obtained by the adder 442 in response to the (E+2)th selection signal ($S_{E+2}$), and outputs the selected signal to the second DAC 28 as the vertical sawtooth drive signal VD2, the gain of which is adjusted. Here, the vertical sawtooth drive signal VD2 is used for correcting the vertical Moire of the displayed screen and driving the vertical sawtooth wave. The T flip flop 448 is reset in response to the vertical Moire off signal Vmoff input to the reset terminal R and toggled in response to the deflection vertical synchronous signal DVS input from the synchronous signal phase converting portion 12 to the clock terminal CK, and outputs the (E+2)th selection signal ($S_{E+2}$) to the multiplexer 446.

The multiplier 436 multiplies the division result obtained by the dividing portion 432 by the horizontal gain GH, and outputs the multiplication result to the multiplier 440. The multiplier 440 multiplies the multiplication result obtained by the multiplier 436 by the EW1 output from the interpolation value calculating portion 20, and outputs the multiplication result to the adder 454. The multiplier 450 multiplies a direct current reference value (DC_ref) by the screen reducing and enlarging ratios of the horizontal direction (Hsize), and outputs the multiplication result to the multiplier 452. The multiplier 452 multiplies the multiplication result obtained by the multiplier 450 by the horizontal period rate (HPR) and outputs the multiplication result to the adder 454. The adder 454 adds the multiplication result obtained by the multiplier 452 to the multiplication result obtained by the multiplier 440, and outputs the addition result to the third DAC 30 (see FIG. 1) as the east-west distortion compensation signal EW2 the gain of which is adjusted.

At this time, the screen reducing and enlarging ratio of the horizontal direction (Hsize) is one among the second predetermined values output from the controlling portion 24 through the input terminal IN3. The reference EHT (EHT_ref), the horizontal and vertical gains GH and GV, the vertical starting position value $V_{POS}$, the direct current reference value DC_ref, the horizontal period rate (HPR), and the vertical Moire value Vm correspond to the third predetermined values received from the controlling portion 24 through the input terminal IN5.

The adder 416 or 454 shown in FIG. 27 or 28 adds the screen reducing and enlarging ratio of the horizontal direction (Hsize) to the east-west distortion compensation signal EW1, thereby the size of the displayed image being controlled by the amplitude of the sawtooth waveform. Therefore, the apparatus 22A or 22B shown in FIG. 27 or 28 corrects the distortion phenomenon that the screen is reduced or enlarged by the EHT. Furthermore, the apparatus 22B shown in FIG. 28 removes the direct current offset of the EW1 by multiplying the DC_ref by the Hsize.

When the frequency of the second horizontal synchronous signal input through the input terminal IN1 of the digital deflection processing apparatus according to the present invention shown in FIG. 1 varies over a wide range, the Moire phenomenon can occur in a certain frequency of the second horizontal synchronous signal. The Moire phenomenon which occurs in a vertical direction is corrected by the output adjusting portion 22 shown in FIG. 1 using the vertical Moire value Vm. Namely, the output adjusting portion 22B shown in FIG. 28 corrects the vertical Moire by intermittently adding the vertical Moire value Vm to the VD2 value in response to the Vmoff value.

Here, the Moire phenomenon which occurs in the horizontal direction can be compensated by the horizontal Moire correcting portion 32 (see FIG. 1). For this, the horizontal Moire correcting portion 32 delays, at a predetermined time interval, the horizontal drive signal HD output from the horizontal drive signal generating portion 18, using the fourth predetermined value input through the input terminal IN7 and in response to the deflection horizontal synchronous signal DHS and the horizontal Moire off signal Hmoff, and outputs the delayed signal through the output terminal OUT1 as the horizontal drive signal for correcting the horizontal Moire and controlling the horizontal deflection circuit for generating the horizontal sawtooth current.

Figure 29:
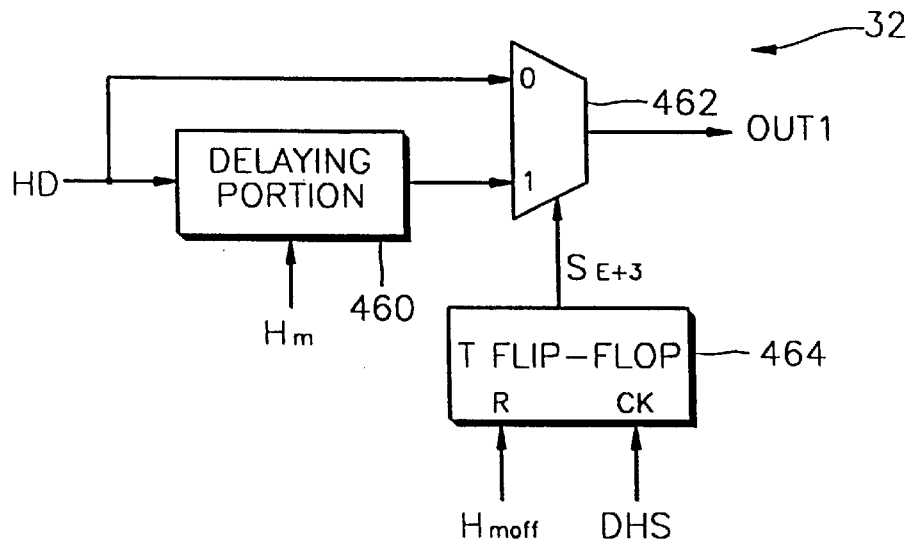
FIG. 29 is a circuit diagram of a preferred embodiment according to the present invention of a horizontal Moire correcting portion shown in FIG. 1.

FIG. 29 is a circuit diagram of a preferred embodiment according to the present invention of the horizontal Moire correcting portion 32 shown in FIG. 1. The horizontal Moire correcting portion is comprised of a delaying portion 460, a multiplexer 462, and a T flip-flop 464.

The delaying portion 460 shown in FIG. 29 delays the horizontal drive signal HD output from the horizontal drive signal generating portion 18, corresponding to the fourth predetermined value received from the controlling portion 24 through the input terminal IN7, i.e., the horizontal Moire value Vm, and outputs the delayed signal to the multiplexer 462. The multiplexer 462 selects either the signal delayed by the delaying portion 460 or the horizontal drive signal HD in response to the (E+3)th selection signal ($S_{E+3}$) and outputs the selected signal through the output terminal OUT1 as the horizontal drive signal HD for correcting the horizontal Moire. At this time, the T flip-flop 464 is initialized in response to the horizontal Moire off signal Hmoff input to the reset terminal R and toggled in response to the deflection horizontal synchronous signal DHS input to the clock terminal CK and outputs the (E+3)th selection signal ($S_{E+3}$) to the multiplexer 462.

The first DAC 26 shown in FIG. 1 converts the dynamic focus signal DF output from the interpolation value calculating portion 20 into an analog signal and outputs the converted analog dynamic focus signal through the output terminal OUT2 as a signal for focusing the beam. The second DAC 28 converts into an analog signal, the digital vertical sawtooth drive signal VD2 output from the output adjusting portion 22 and outputs the converted analog vertical sawtooth drive signal to a vertical yoke through the output terminal OUT3. Also, the third DAC 30 converts the east-west distortion compensation signal EW2 into an analog signal and outputs the converted analog east-west distortion compensation signal through the output terminal OUT4 as the signal for correcting the EW distortion of the pincushion. The above-mentioned first, second, and third DACs 26, 28, and 30 can employ a compensating portion of 14-bit current driving type.

The controlling portion 24 shown in FIG. 1 inputs a serial clock (SCK) and a serial data (SDAT) and outputs a synchronous control signal SC for controlling the selection of the composite synchronous signal by the interfacing portion 42, a seed value SEED required by the interpolation value calculating portion 20 and the interlace control signal IC according to whether the apparatus shown in FIG. 1 is used for a television or a computer. Also, the controlling portion 24 outputs first, second, third, and fourth predetermined values, and a predetermined duty value to corresponding blocks through the input terminals IN2, IN3, IN5, IN6, and IN7, corresponding to the serial data SDAT.

Figure 30:
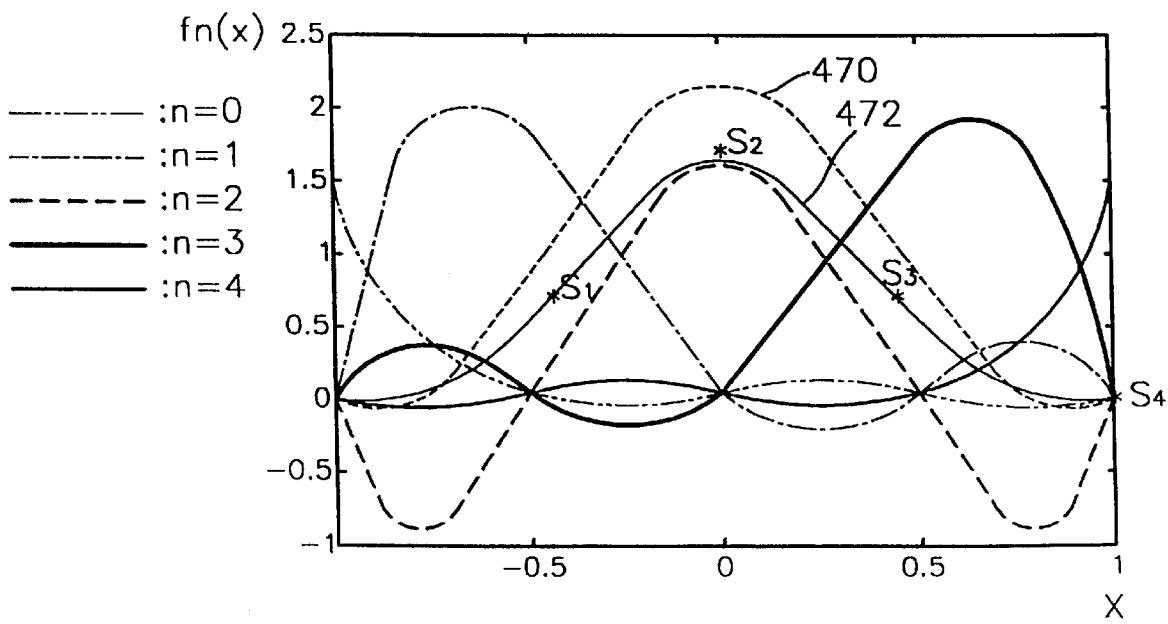
FIG. 30 is a graph of lagrange functions.

FIG. 30 is a graph showing the lagrange functions [$f_0(X)$ through $f_4(X)$]. A vertical axis shows the lagrange function and a horizontal axis shows the X axis coordinate value (X) of the horizontal direction.

Figure 31:
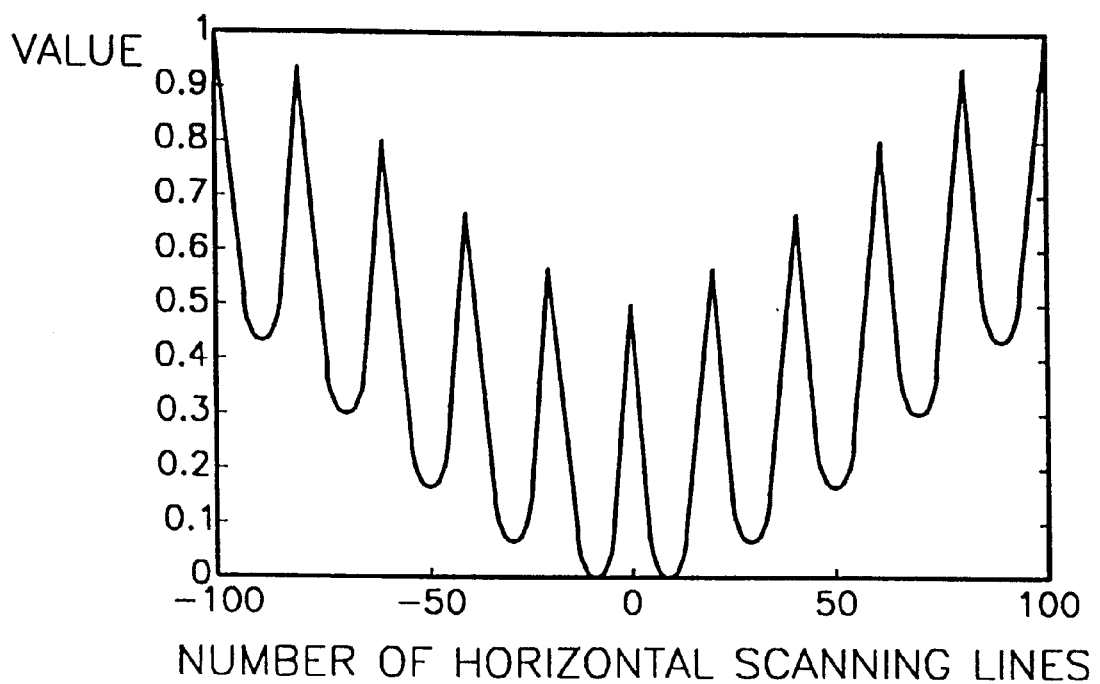
FIG. 31 is a waveform showing a dynamic focus signal.

FIG. 31 is a waveform showing a dynamic focus signal. The vertical axis shows the level (value) of the dynamic focus signal. The horizontal axis shows the number of the horizontal scanning lines.

In order to appreciate the understanding of the operation of the digital deflection processing apparatus according to the present invention shown in FIG. 1, it is assumed that five seed values are input from the controlling portion 24 to the interpolation value calculating portion 20 as shown in TABLE 1.

TABLE 1

|  | $s_0$ | $s_1$ | $s_2$ | $s_3$ | $s_4$ |
| --- | --- | --- | --- | --- | --- |
| seed value | 0.0 | 0.7 | 1.5 | 0.7 | 0.0 |

When the five seed values are given as shown in FIG. 1, the lagrange functions of Equation 6 are shown in FIG. 30. The dynamic focus signal for correcting the focus in the vertical and horizontal directions, output through the output terminal OUT2 shown in FIG. 1, is shown in FIG. 31.

At this time, the distortion correcting function [F(X)] 470 shown in FIG. 30 is obtained when the lagrange functions of Equation 6 are substituted for Equation 2. When the lagrange functions of Equation 6 are substituted for Equation 7, the interpolation curve 472 is obtained as shown in FIG. 30.

As a result, the deflection processing apparatus according to the present invention shown in FIG. 1 can be applied to the television using the embodiments shown in FIGS. 2 through 6, 12, 15, and 27 and can be applied to the computer in which the horizontal synchronous signal has a wide frequency band using the embodiments shown in FIGS. 10, 11, 14, 16, 28, and 29. At this time, the embodiments shown in FIGS. 17 through 19, 22, 23, and 25 can be commonly applied to a television or a computer.

In the above-mentioned description according to the present invention, a situation in which the second horizontal synchronous signal having a wide frequency is input through the input terminal IN1 is restricted to the case in which the apparatus shown in FIG. 1 is the deflection processing apparatus used for the cathode ray tube of the computer. However, the apparatus shown in FIG. 1 can be applied to other systems than the computer in which the frequency of the second horizontal synchronous signal input through the input terminal IN1 varies over a wide range.

As mentioned above, in the digital deflection processing apparatus for the cathode ray tube according to the present invention and the deflection processing method therefor, it is possible to digitally precisely and automatically minimize jitter in the vertical and horizontal directions and the screen distortion phenomenons since the deflection processing is digitally performed. Also, since the distortion correcting waveform of the horizontal direction can be simultaneously generated when the vertical sawtooth wave is generated, it is possible to perform the tilt correction without an additional tilt correcting apparatus as well as the EW correction. Furthermore, since the distortion due to the variation of EHT is corrected corresponding to the quantity of the beam, the manufacturing expenses of the deflection apparatus are reduced. Moreover, it is possible to process a horizontal synchronous signal input having a wide frequency range and to effectively reduce the Moire phenomenon.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A digital deflection processing apparatus in a cathode ray tube, comprising:

synchronous signal and clock signal generating means for selecting, as a selected signal, either a first composite synchronous signal extracted from a composite video broadcasting signal or at least one externally-generated second composite synchronous signals in response to a synchronous control signal and outputting the selected signal as a third composite synchronous signal, and for generating a main clock signal;

synchronous signal phase converting means for lagging or leading the phase of the third composite synchronous signal by a first predetermined value and outputting the lagged or led third composite synchronous signal as a deflection composite synchronous signal comprising a deflection horizontal synchronous signal and a deflection vertical synchronous signal;

coordinate value generating means for performing counting, synchronized with the deflection composite synchronous signal, processing the counting result with second predetermined values, and outputting the processed result as X and Y beam-axis coordinate values;

selection signal generating means for processing the counting result and outputting the logical combination result as selection signals;

horizontal drive signal generating means for determining rising and falling edges of a horizontal drive signal, using a phase difference between a fly back pulse and the horizontal drive signal;

interpolation value calculating means for calculating subsequent distortion correcting functions in response to the selection signals, calculating the respective interpolation values of the X and Y axis coordinate values using the distortion correcting functions, and outputting calculated interpolation values as output signals; and output adjusting means for adjusting the gains of the output signals based on a voltage obtained by monitoring EHT of the cathode ray tube;

wherein the third composite synchronous signal comprises a third horizontal synchronous signal and a third vertical synchronous signal and the main clock signal is output to the synchronous signal phase converting means, the coordinate value generating means, the selection signal generating means, the horizontal drive signal generating means, the interpolation value calculating means, and the output adjusting means.

2. The digital deflection processing apparatus of claim 1, wherein the distortion correcting functions comprise functions F(X) and F(Y), represented by:

$$F(X) = s_0 f_0(X) + s_1 f_1(X) + \ldots + s_n f_n(X)$$

$$F(Y) = s_0 f_0(Y) + s_1 f_1(Y) + \ldots + s_n f_n(Y)$$

wherein, $s_0$ through $s_n$ are seed values and $f_0(X)$ through $f_n(X)$ and $f_0(Y)$ through $f_n(Y)$ are language functions.

3. The digital deflection processing apparatus of claim 1 further comprising controlling means for generating the synchronous control signal.

4. The digital deflection processing apparatus of claim 1 wherein the third composite synchronous signal comprises a third horizontal synchronous signal and a third vertical synchronous signal and the main clock signal is output to the synchronous signal phase converting means, the coordinate value generating means, the selection signal generating means, the horizontal drive signal generating means, the interpolation value calculating means, and the output adjusting means.

5. The digital deflection processing apparatus of claim 1 wherein the output signals comprise a horizontal control signal, a dynamic focus signal, a vertical sawtooth drive signal and an east-west distortion compensation signal (EW1).

6. The digital deflection processing apparatus of claim 1, wherein the synchronous signal and clock signal generating means generates the main clock signal using the composite video broadcasting signal.

7. The digital deflection processing apparatus of claim 1, wherein the synchronous signal and clock signal generating means generates the main clock signal using an external clock signal, and wherein the second composite synchronous signal has a frequency that is variable.

8. The digital deflection processing apparatus of claim 1, wherein the at least one composite synchronous signals is included in a digital image signal transferred according to CCIR656 format.

9. The digital deflection processing apparatus of claim 1, wherein the synchronous signal and clock signal generating means comprises:

clock and synchronous signal extracting means for extracting the main clock signal and the first composite synchronous signal using the composite video broadcasting signal;

interfacing means for selecting, as a selected signal, either the first composite synchronous signal or one among the at least one second composite synchronous signals in response to the synchronous control signal, and outputting the selected signal as a fourth composite synchronous signal; and horizontal and vertical tracking means for stabilizing jitter of the fourth composite synchronous signal and for outputting the fourth composite synchronous signal, the jitter of which is stabilized, as the third composite synchronous signal.

10. The digital processing deflection apparatus of claim 9, wherein the synchronous and clock signal generating means comprises:

first analog to digital converting means for converting the composite video broadcasting signal from an analog signal into a digital signal and for outputting the digital composite video broadcast signal;

synchronous signal extracting means for extracting the first composite synchronous signal from the digital composite video broadcast signal;

first selecting means for selecting, as a selected signal, one either the first composite synchronous signal or the second composite synchronous signal in response to the synchronous control signal and outputting the selected signal as a fifth composite synchronous signal; and a digital phase synchronous loop for synchronizing the fifth composite synchronous signal with the external clock signal, generating the third composite synchronous signal using the fifth composite synchronous signal synchronized with the external clock signal, and generating the main clock signal having, a period which is an integer multiple of that of the third horizontal synchronous signal.

11. The digital deflection processing apparatus of claim 9, wherein the horizontal tracking means comprises:

a first counter for performing counting in response to the main clock signal and being reset in response to the third horizontal synchronous signal;

a first latch for latching first counting values T1K counted by the first counter, where $1 \leq K \leq i$, and i is an integer not less than 2, in response to a fourth horizontal synchronous signal included in the fourth composite synchronous signal;

first window forming means for outputting first maximum values (Wmax1, Wmax1', and Wmax1") and first minimum values (Wmin1, Wmin1', and Wmin1") on a first standard window, a first decrease window and a first increase window formed corresponding to the first counting values output from the first latch;

first mode determining means for comparing a point of time at which the fourth horizontal synchronous signal is generated with the first maximum values and the first minimum values, and outputting a first mode signal corresponding to the comparison result;

horizontal synchronous signal generating means for selectively outputting a signal using a first counting value (T11) at a point of time where the first maximum value (Wmax1) is generated, or the fourth horizontal synchronous signal as the third horizontal synchronous signal, in response to the first mode signal; and frequency-multiplying means for doubling the frequency of the fourth horizontal synchronous signal and outputting a doubled frequency signal (2HS4) having a doubled frequency.

12. The digital deflection processing apparatus of claim 11, wherein the vertical tracking means comprises:

a second counter for performing counting in response to a doubled frequency signal (2HS4) and being reset in response to the third vertical synchronous signal;

a second latch for latching second counting values (T2K) counted by the second counter in response to a fourth vertical synchronous signal included in the fourth composite synchronous signal;

second window forming means for outputting second maximum values (Wmax2, Wmax2', and Wmax2") and second minimum values (Wmin2, Wmin2', and Wmin2") of a second standard window, a second decrease window, and a second increase window, formed corresponding to the second counting values output from the second latch;

second mode determining means for comparing a point of time at which the fourth vertical synchronous signal is generated with the second maximum values and the second minimum values, and outputting a second mode signal corresponding to the comparison result; and vertical synchronous signal generating means for selectively outputting a signal using a second counting value (T21) at a point of time where the second maximum value (Wmax2) is generated, or the fourth vertical synchronous signal as the third vertical synchronous signal, in response to the second mode signal.

13. The digital deflection processing apparatus of claim 10, wherein the synchronous signal phase converting means multiplies a frequency of the deflection horizontal synchronous signal by a predetermined number and outputs a multiplied deflection horizontal synchronous signal.

14. The digital deflection processing apparatus of claim 10, wherein the synchronous signal phase converting means comprises:

first adding means for adding the third horizontal synchronous signal to a horizontal change amount and outputting the addition result;

second adding means for adding the addition result obtained by the first adding means to a horizontal starting position value and outputting the addition result as the deflection horizontal synchronous signal; and third adding means for adding the third vertical synchronous signal to a vertical change amount and outputting the addition result as the deflection vertical synchronous signal, wherein the horizontal change amount, the horizontal starting position value, and the vertical change amount correspond to the first predetermined value.

15. The digital deflection processing apparatus of claim 14, wherein the synchronous signal phase converting means comprises:

a third counter for performing counting in response to the main clock signal and being reset in response to the third horizontal synchronous signal;

a fourth counter for performing counting in response to the third horizontal synchronous signal and being reset in response to the third vertical synchronous signal;

fourth adding means for adding the value counted by the third counter to the horizontal change amount and outputting the addition result;

fifth adding means for adding the addition result obtained by the fourth adding means to the horizontal starting position value and outputting the addition result;

sixth adding means for adding the counting result obtained by the fourth counter to the vertical change amount and outputting the addition result;

first comparing means for comparing the addition result obtained by the fifth adding means with a period of the third horizontal synchronous signal and outputting a signal having a level corresponding to the comparison result as the deflection horizontal synchronous signal;

second comparing means for comparing the addition result obtained by the fifth adding means with a half period of the third horizontal synchronous signal and outputting a signal having a level corresponding to the comparison result;

OR operation means for performing an OR operation on the signal output from the second comparing means and the deflection horizontal synchronous signal and outputting the OR operation result as the multiplied deflection horizontal synchronous signal; and third comparing means for comparing the addition result obtained by the sixth adding means with a period of the third vertical synchronous signal and outputting a signal having a level corresponding to the comparison result as the deflection vertical synchronous signal, wherein the horizontal change amount, the vertical change amount, the horizontal starting position value, the period and the half period of the third horizontal synchronous signal, and the period of the third vertical synchronous signal correspond to the first predetermined value.

16. The digital deflection processing apparatus of claim 1, wherein the coordinate value generating means comprises:

X coordinate value generating means for performing counting, in response to the main clock signal and synchronized with the deflection horizontal synchronous signal, normalizing the counting result as a normalized value, and outputting the normalized value;

Y coordinate value generating means for performing counting, in response to the doubled frequency signal (2HS4) and synchronized with the deflection vertical synchronous signal, normalizing the counting result and outputting the normalized value;

first multiplying means for multiplying the normalized value output from the X coordinate value generating means by a screen reducing and enlarging ratio of the horizontal direction, and outputting the multiplication result to the interpolation value calculating means as the X axis coordinate value; and second multiplying means for multiplying the normalized value output from the Y coordinate value generating means by the screen reducing and enlarging ratio of the vertical direction, and outputting the multiplication result to the interpolation value calculating means as the Y axis coordinate value, wherein the screen reducing and enlarging ratios of the horizontal and vertical directions correspond to the second predetermined values.

17. The digital deflection processing apparatus of claim 16, wherein the coordinate value generating means comprises:

a fifth counter for performing counting, synchronized with the deflection horizontal synchronous signal and in response to the main clock signal and outputting the counting result;

second selecting means for selectively outputting either the deflection horizontal synchronous signal or the multiplied deflection horizontal synchronous signal in response to an interlace control signal;

a sixth counter for performing counting, synchronized with the deflection vertical synchronous signal and in response to a signal selected from the second selecting means and outputting the counting result;

first subtracting means for subtracting a half period of the deflection horizontal synchronous signal from the output of the fifth counter and outputting the subtraction result;

second subtracting means for subtracting a half period of the deflection vertical synchronous signal from the output of the sixth counter and outputting the subtraction result;

third multiplying means for multiplying the subtraction result obtained by the first subtraction means, a screen reducing and enlarging ratio of the horizontal direction, and the horizontal period rate with one another and outputting the multiplication result as the X axis coordinate value; and fourth multiplying means for multiplying the subtraction result obtained by the second subtracting means, the screen reducing and enlarging ratio of the vertical direction, and the vertical period rate with one another and outputting the multiplication result as the Y axis coordinate value;

wherein the interlace control signal is output from the controlling means, and the screen reducing and enlarging ratios of the horizontal and vertical directions, the horizontal and vertical period rates, and the half periods of the deflection vertical and horizontal synchronous signals correspond to the second predetermined values.

18. The digital deflection processing apparatus of claim 1, wherein the digital deflection processing apparatus for the cathode ray tube further comprises digital-to-analog converting means for converting the digital output signals into analog signals.

19. The digital deflection processing apparatus of claim 1, wherein the horizontal drive signal generating means comprises:

phase difference stabilizing means for detecting the phase difference, as a detected phase difference, using the horizontal drive signal and the main clock signal, stabilizing jitter of the detected phase difference using the main clock signal and the fly back pulse, and outputting the phase difference, the jitter of which is stabilized;

seventh adding means for adding the phase difference the jitter of which is stabilized, the horizontal correcting signal, and a predetermined correcting value to one another and outputting the addition result; and operating means for performing counting in response to the deflection horizontal synchronous signal, subtracting the addition result obtained by the seventh adding means from the counted value, determining the subtraction result as the rising edge, subtracting the predetermined duty value from the rising edge, and determining the subtraction result as the falling edge.

20. The digital deflection processing apparatus of claim 19, wherein the phase difference stabilizing means comprises:

sub clock detecting means for dividing the period of the main clock signal into N sections where N is an integer not less than 2, detecting a section into which the fly back pulse is input among the N divided sections, and outputting a value assigned to a detected section of the detected phase difference as a decimal of the phase difference;

first phase difference detecting means for detecting the integer value of the phase difference using the main clock signal and the horizontal drive signal, and outputting the decimal and the integer value in response to the main clock signal and the fly back pulse; and a loop filter for stabilizing the jitter of the integer value using the filtered decimal, and outputting, as the phase difference, the integer value.

21. The digital deflection processing apparatus of claim 20, wherein the first phase difference detecting means comprises:

a seventh counter for performing counting, in response to the main clock signal and synchronized with the horizontal drive signal, and outputting the counted value as the integer value;

clock signal generating means for delaying the fly back pulse in response to the main clock signal, and outputting the delayed pulse as first and second clock signals; and a third latch for latching the decimal output from the sub clock detecting means and the integer value output from the seventh counter in response to the first clock signal.

22. The digital deflection processing apparatus of claim 21, wherein the loop filter comprises:

eighth adding means for adding the values output from the third latch to a fourth predetermined value, and outputting the addition result;

third selecting means for selectively outputting one among the values output from the third latch and the addition result obtained by the eighth adding means in response to an (E+1)th selection signal;

a low-pass-filter for low-pass-filtering the output of the third selecting means in response to the second clock signal, and outputting the integer value of the low-pass-filtered value as the phase difference; and jitter determining means for comparing the decimal of the low-pass-filtered value with '0', and outputting the (E+1)th selection signal corresponding to the comparison result.

23. The digital deflection apparatus of claim 22, wherein the low-pass-filter comprises:

a register;

fifth multiplying means for multiplying the output of the register by $$\frac{1}{2^N}$$

and outputting the multiplication result;

third subtracting means for subtracting the output of the fifth multiplying means from the output of the register;

ninth adding means for adding the output of the third selecting means to the output of the third subtracting means and outputting the addition result; and sixth multiplying means for multiplying the output of the ninth adding means by $$\frac{1}{2^N}$$

and outputting the multiplication result as the integer value the jitter of which is stabilized, wherein the register latches the output of the ninth adding means in response to the second clock signal.

24. The digital deflection processing apparatus of claim 1, wherein the interpolation value calculating means comprises:

size restricting means for restricting the size of the X and Y coordinate values and outputting a restriction result;

polynomial generating means for accumulating input signals and storing polynomials of Lagrange functions of the input signals;

function storing means for storing the Lagrange functions and the distortion correcting means;

seed value storing means for storing externally-generated seed values received from the controlling means, and internally-generated seed values;

interpolation value storing means for outputting the interpolation value of the vertical direction among stored interpolation values as the internally-generated seed value, and outputting the interpolation value of the horizontal direction as the output signal;

fourth selecting means for selectively outputting one among an output of the polynomial generating means, the value stored in the function storing means, and the output of the size restricting means, in response to a first selection signal;

fifth selecting means for selectively outputting one among the output of the size restricting means, the seed values output from the seed value storing means, and the output of the polynomial generating means, in response to a second selection signal;

seventh multiplying means for multiplying the output of the fourth selecting means by the output of the fifth selecting means and outputting the multiplication result; and sixth selecting means for selectively outputting the output of the seventh multiplying means to one among the polynomial generating means, the function storing means, and the interpolation value storing means, in response to the third selection signal.

25. The digital deflection processing apparatus of claim 1, wherein the output adjusting means corrects a vertical Moire of the output signals, using a vertical sawtooth drive signal, the gain of which is adjusted, an east-west distortion compensation signal (EW1) the gain of which is adjusted, and a fifth predetermined value.

26. The digital deflection processing apparatus of claim 1, wherein the output adjusting means comprises:

second analog-to-digital converting means for converting a voltage obtained by distributing the electric high tension (EHT) of the cathode ray tube into a digital signal, and outputting a converted digital signal;

fourth subtracting means for subtracting a reference EHT from the output of the second analog-to-digital converting means and outputting the subtraction result;

eighth multiplying means for multiplying the output of the fourth subtracting means by a horizontal gain, and outputting the multiplication result;

tenth adding means for adding the screen reducing and enlarging ratio of the horizontal direction, the output of the eighth multiplying means, and east-west distortion compensation signals (EW1) output from the interpolation value calculating means to one another, and outputting the addition result to one among the first and second digital-to-analog converting means as the east-west distortion compensation signal (EW1) the gain of which is adjusted;

ninth multiplying means for multiplying the output of the fourth subtracting means by the vertical gain, and outputting the multiplication result;

tenth multiplying means for multiplying the vertical sawtooth drive signal by the output of the ninth multiplying means, and outputting the multiplication result; and eleventh adding means for adding the output of the tenth multiplying means to the vertical starting position value, and outputting the addition result to another among the first and second digital-to-analog converting means as the vertical sawtooth drive signal the gain of which is adjusted, wherein the screen reducing and enlarging ratio of the horizontal direction corresponds to one among the second predetermined values and the vertical and horizontal gains, the reference EHT, and the vertical starting position value corresponds to the third predetermined values.

27. The digital deflection processing apparatus of claim 23, wherein the output adjusting means comprises:

third analog-to-digital converting means for converting the voltage obtained by distributing the EHT of the cathode ray tube into a digital signal and outputting a converted digital signal;

dividing means for dividing the output of the third analog-to-digital converting means by the reference EHT and outputting the division result;

eleventh multiplying means for multiplying the output of the multiplying means by the vertical gain, and outputting the multiplication result;

twelfth multiplying means for multiplying the output of the dividing means by the horizontal gain, and outputting the multiplication result;

thirteenth multiplying means for multiplying the multiplication result obtained by the eleventh multiplying means by the vertical sawtooth drive signal from the interpolation value calculating means, and outputting the multiplication result;

fourteenth multiplying means for multiplying the multiplication result obtained by the twelfth multiplying means by the east-west distortion compensation signal (EW1) output from the interpolation value calculating means, and outputting the multiplication result;

twelfth adding means for adding the multiplication result obtained by the thirteenth multiplying means to the vertical starting position value, and outputting the addition result;

thirteenth adding means for adding the addition result obtained by the twelfth adding means to a vertical Moire value, and outputting the addition result;

seventh selecting means for selecting either the addition result obtained by the twelfth adding means or the addition result obtained by the thirteenth adding means, in response to an (E+2)th selection signal, and outputting the selected signal as the vertical sawtooth drive signal the gain of which is adjusted and the vertical Moire is corrected;

a first flip-flop initialized in response to a vertical Moire off signal, toggled in response to the deflection vertical synchronous signal for outputting the (E+2)th selection signal;

fifteenth multiplying means for multiplying the screen reducing and enlarging ratio of the horizontal direction by the horizontal period rate, and outputting the multiplication result; and fourteenth adding means for adding the multiplication result obtained by the fifteenth multiplying means to the multiplication result obtained by the fourteenth multiplying means, and outputting the addition result as the east-west distortion compensation signal (EW1) the gain of which is adjusted, wherein the screen reducing and enlarging ratio of the horizontal direction corresponds to one among the second predetermined values, and the reference EHT, the horizontal and vertical gains, the vertical starting position value, and the horizontal period rate correspond to the third predetermined values, and the vertical Moire value corresponds to fifth predetermined values.

28. The digital deflection processing apparatus of claim 27, wherein the fifteenth multiplying means multiplies the screen reducing and enlarging ratio of the horizontal direction, the horizontal period rate, and a direct current reference value with one another, and outputs the multiplication result to the fourteenth adding means and the direct current reference value corresponds to the third predetermined value for correcting the offset of the east-west distortion compensation signal EW1 the gain of which is adjusted.

29. The digital deflection processing apparatus of claim 1, wherein the digital deflection processing apparatus further comprises horizontal Moire correcting means for delaying the horizontal drive signal output from the horizontal drive signal generating means at a predetermined time interval, using a sixth predetermined value and in response to the deflection horizontal synchronous signal, and outputting the delayed signal as a horizontal drive signal for correcting horizontal Moire.

30. The digital deflection processing apparatus of claim 29, wherein the horizontal Moire correcting means comprises:

delaying means for delaying the horizontal drive signal corresponding to a horizontal Moire value and outputting the delayed signal; p1 eighth selecting means for selecting either the signal delayed by the delaying means or the horizontal drive signal output from the horizontal drive signal generating means, in response to an (E+3)th selection signal, and outputting the selected signal as the horizontal drive signal for correcting the horizontal Moire; and a second flip-flop for outputting the (E+3)th selection signal initialized in response to a horizontal Moire off signal and toggled in response to the deflection horizontal synchronous signal, wherein the horizontal Moire value corresponds to the sixth predetermined value.

31. A phase difference detecting apparatus in a digital deflection processing apparatus for a cathode ray tube, for digitally performing deflection processing using a system clock signal, comprising:

phase difference detecting means for dividing a period of the system clock signal into N sections, where N is an integer not less than 2, for detecting a section to which a comparison signal non-synchronized with the system clock signal is input among the N divided sections, and for outputting the value assigned to the detected section as the decimal value of a phase difference between a reference signal synchronized with the system clock signal and the comparison signal;

second phase difference detecting means for detecting the integer value of the phase difference using the system clock signal and the reference signal, and outputting the decimal value and the integer value in response to the system clock signal and the comparison signal; and a loop filter for stabilizing the jitter of the integer value using the filtered decimal and outputting the integer value, the jitter of which is stabilized and which is filtered, as the phase difference.

32. A window forming method performed in a window forming portion of a digital deflection processing apparatus for a cathode ray tube, having a counter for performing counting in response to a counting signal and being reset in response to a jitter-stabilized synchronous signal, the window forming portion for outputting the maximum values and the minimum values of standard, increase, and decrease windows, corresponding to count values (TK) counted by the counter, where $1 \leq K \leq i$, and where i is an integer not less than 2, a mode determining portion for comparing the maximum and minimum values with the point at which a jitter-unstabilized synchronous signal is generated and determining a mode corresponding to the comparison result, and a synchronous signal generating portion for generating a jitter-stabilized synchronous signal is corresponding to the determined mode, for digitally performing deflection processing comprising the steps of:

determining a maximum value (Tmax) and a minimum value (Tmin) among the counted values;

obtaining a subtraction value by subtracting the minimum value (Tmin) from the maximum value (Tmax);

subtracting a result obtained by dividing the subtraction value by a first predetermined number from the minimum value (Tmin), adding the result obtained by dividing the subtraction value by the first predetermined number to the maximum value (Tmax), and determining the subtraction and addition results as the minimum value (Wmin) and the maximum value (Wmax) of the standard window, respectively;

determining the (Wmin) as the maximum value (Wmax') of the decrease window;

determining a second predetermined number as the minimum value (Wmin') of the decrease window; and determining third and fourth predetermined numbers, respectively, as the maximum value (Wmax") and the minimum value (Wmin") of the increase window.

33. The method of claim 32, wherein the frequency of the counting signal is obtained by doubling a frequency of an externally-input horizontal synchronous signal, the counter is a line counter, and the synchronous signal is a vertical synchronous signal.

34. The method of claim 32, wherein the counting signal is a main clock signal, the counter is a pixel counter, and the synchronous signal is the horizontal synchronous signal.

35. The method of claim 32, wherein a mode determining method performed by a mode determining portion comprises the steps of:

determining whether the jitter-stabilized synchronous signal is detected not less than a first predetermined number of times in the standard window;

determining the mode as a standard mode when the jitter-unstabilized synchronous signal is detected not less than the first predetermined number of times in the standard window;

determining whether the jitter-unstabilized synchronous signal is dropped out not less than second predetermined times in at least one among the standard, increase, and decrease windows when the jitter-unstabilized synchronous signal is not detected not less than the first predetermined times in the standard window;

determining the mode as a no signal mode when the jitter-unstabilized synchronous signal is dropped out in at least one among the windows not less than second predetermined times; and determining the mode as a non-standard mode when the jitter-unstabilized synchronous signal is not dropped out the second predetermined number of times in all windows.

36. The method of claim 35, wherein the synchronous signal generating method for generating the jitter-unstabilized synchronous signal from the synchronous signal generating portion comprises the steps of:

determining whether the mode is the standard mode;

determining the signal having the most recently counted value as a period as the jitter-stabilized synchronous signal when the mode is the standard mode;

judging whether the mode is the no signal mode when the mode is not the standard mode;

generating by itself the jitter-stabilized synchronous signal when the mode is the no signal mode;

determining whether the jitter-unstabilized synchronous signal is detected in the standard window when the mode is not the no signal mode;

determining whether the jitter-unstabilized synchronous signal is detected in the decrease window when the jitter-unstabilized synchronous signal is not detected in the standard window;

generating by itself the jitter-stabilized synchronous signal when the jitter-unstabilized synchronous signal is not detected in the decrease window; and determining the jitter-unstabilized synchronous signal as the jitter-stabilized synchronous signal when the jitter-unstabilized synchronous signal is detected in the standard window or the decrease window.

37. An interpolation value calculating method performed in an interpolation value calculating portion in a digital deflection apparatus for a cathode ray tube, for calculating the interpolation values of the X and Y axis coordinate values of a beam using distortion correcting functions [F(X) and F(Y)], comprising the steps of:

restricting the size of the X and Y axis coordinate values;

obtaining lagrange functions [$f_0(X)$ through $f_n(X)$ and $f_0(Y)$ through $f_n(Y)$] comprising an nth order polynomial with respect to the X and Y axis coordinate values, by a time division method;

determining whether the seed values $s_0$ through $s_n$ of a currently scanned line are externally provided;

obtaining internal seed values when the seed values are not externally provided;

obtaining distortion correcting functions using the seed values and the lagrange functions represented by:

$$F(X)=s_0f_0(X)+s_1f_1(X)+\ldots+s_nf_n(X)$$

and $$F(Y)=s_0f_0(Y)+s_1f_1(Y)+\ldots+s_nf_n(Y);$$

and calculating the interpolation values with respect to the X and Y values by substituting the X and Y values for the distortion correcting functions.

38. An interpolation value calculating apparatus in a digital beam deflection processing apparatus for a cathode ray tube comprising:

means for restricting the sizes of the X and Y coordinate values of the beam;

means for calculating lagrange functions based on the X and Y values;

means for calculating distortion correcting functions using the lagrange functions, represented by:

$$F(X)=s_0f_0(X)+s_1f_1(X)+\ldots+s_nf_n(X)$$

and $$F(Y)=s_0f_0(Y)+s_1f_1(Y)+\ldots+s_nf_n(Y)$$

where, $s_0$ through $s_n$ represent seed values and $f_o(X)$ through $f_n(X)$, and $f_0(Y)$ through $f_n(Y)$ represent lagrange functions; and means for calculating interpolation values with respect to X and Y by substituting X and Y for the distortion correction functions.

39. The apparatus of claim 38, wherein the interpolation value calculating apparatus comprises:

size restricting means for restricting the sizes of X and Y and outputting X and Y having the restricted size;

polynomial generating means for accumulating input signals and storing the polynomials of the lagrange functions;

function storing means for storing the lagrange functions and the distortion correcting functions;

seed value storing means for storing the seed values;

interpolation value storing means for outputting the stored interpolation values of the vertical and horizontal directions;

first selecting means for selectively outputting one among the output of the polynomial generating means, the value stored in the function storing means, and the output of the size restricting means, in response to a first selection signal;

second selecting means for selectively outputting one among the output of the size restricting means, the seed value, and the output of the polynomial generating means, in response to a second selection signal;

multiplying means for multiplying the output of the first selecting means by the output of the second selecting means and outputting the multiplication result; and third selecting means for selectively outputting the output of the multiplying means to one among the polynomial generating means, the function storing means, and the interpolation value storing means, in response to a third selection signal, wherein the values output from the third selecting means to the interpolation value storing means are the interpolation values of the vertical and horizontal directions.

40. The apparatus of claim 39, wherein a portion of the seed values are externally-provided and another portion of the seed values comprise interpolation values of the vertical direction output from the interpolating value storing means.

41. The apparatus of claim 40, wherein the interpolation value of the horizontal direction is output as a horizontal correct signal, a dynamic focus signal, a vertical sawtooth drive signal, or an east-west distortion compensation signal (EW1).

* * * * *